(12) United States Patent
Kikuchi et al.

(10) Patent No.: US 8,314,493 B2
(45) Date of Patent: Nov. 20, 2012

(54) METHOD FOR MANUFACTURING A PACKAGE-ON-PACKAGE TYPE SEMICONDUCTOR DEVICE

(75) Inventors: Takashi Kikuchi, Kanagawa (JP); Tomoaki Hashimoto, Kanagawa (JP); Tatsuya Hirai, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/900,407

(22) Filed: Oct. 7, 2010

(65) Prior Publication Data

US 2011/0089563 A1    Apr. 21, 2011

(30) Foreign Application Priority Data

Oct. 15, 2009 (JP) ................. 2009-238459

(51) Int. Cl.
*H01L 23/48* (2006.01)
(52) U.S. Cl. ........ 257/738; 257/787; 257/686; 257/777; 257/781; 257/E21.499; 257/E23.021

(58) Field of Classification Search .................. 257/738, 257/E21.499, E23.021, 787, 686, 777, 781; 438/124

See application file for complete search history.

(56) References Cited

U.S. PATENT DOCUMENTS

| 7,034,386 B2 | 4/2006 | Kurita |
| 2007/0096287 A1 | 5/2007 | Araki et al. |
| 2007/0273049 A1* | 11/2007 | Khan et al. ............... 257/787 |

FOREIGN PATENT DOCUMENTS

| JP | 2008-118152 A | 5/2006 |
| JP | 2007-123454 A | 5/2007 |

* cited by examiner

*Primary Examiner* — Marc Armand
*(74) Attorney, Agent, or Firm* — Miles & Stockbridge P.C.

(57) ABSTRACT

Bump electrodes (conductive members) bonded onto lands disposed at a peripheral portion side than terminals (bonding leads) electrically coupled to pads (electrode pads) of a microcomputer chip (semiconductor chip) are sealed with sealing resin (a sealing body). Thereafter, the sealing resin is ground (removed) partially such that a part of each of the bump electrodes is exposed. The step of protruding the part of each of the bump electrodes from a front surface of the sealing resin is performed, after the grinding step.

17 Claims, 27 Drawing Sheets

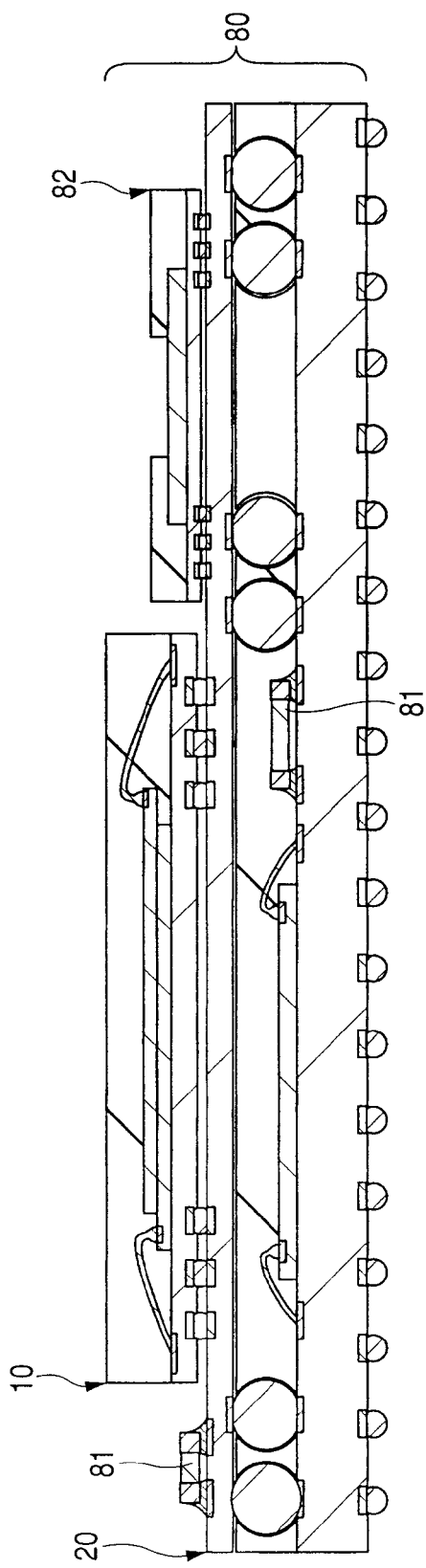

METHOD FOR MANUFACTURING A PACKAGE-ON-PACKAGE TYPE SEMICONDUCTOR DEVICE

CROSS-REFERENCE TO RELATED APPLICATIONS

The disclosure of Japanese Patent Application No. 2009-238459 filed on Oct. 15, 2009 including the specification, drawings and abstract is incorporated herein by reference in its entirety.

BACKGROUND OF THE INVENTION

The present invention relates to a semiconductor device and a technique for manufacturing the same. Particularly, the present invention is concerned with a technique applicable effectively to an electronic device (a semiconductor device) comprising a base member with an electronic part such as a semiconductor chip mounted on a main surface thereof and another wiring substrate stacked over the main surface of the base member.

Recently there has been a growing demand for the reduction in size of electronic devices such as semiconductor devices. Consequently, for diminishing a packaging area of a semiconductor device and a chip part mounted on a packaging substrate (mother board), it is considered effective to mount a plurality of electronic parts (semiconductor chips) on one electronic device (semiconductor device).

As a semiconductor device of such a configuration, a POP (Package on Package) type semiconductor device is being studied, in which a plurality of semiconductor chips are fabricated as separate packages and on one package is stacked another package, as disclosed, for example, in Japanese Unexamined Patent Publication No. 2007-123454 (Patent Document 1).

As a package configuration used in a POP type semiconductor device there is known, for example, the configuration illustrated in FIGS. 11 and 12 of Japanese Unexamined Patent Publication No. 2008-118152 (Patent Document 2). In Patent Document 2 there is used a wiring substrate comprising a wiring body formed on the substrate and conductor posts (conductor protrusions) provided on the wiring body. Further, an IC chip is flip-chip-coupled to one surface of the wiring body and the IC chip and the conductor posts are covered and sealed with insulating resin on one surface of the substrate. Thereafter, the resin is subjected to grinding to expose end faces of the conductor posts.

SUMMARY OF THE INVENTION

In the case of such a semiconductor device as is disclosed in Patent Document 1, on a main surface of a substrate of the lower package, lands for coupling to the upper package are arranged around the semiconductor chip mounted on the substrate. Therefore, for sealing the semiconductor chip while sidestepping the lands, it is necessary to adopt a so-called top gate method wherein the resin for sealing the semiconductor chip is supplied from above the semiconductor chip, as shown in FIG. 7 of Patent Document 1.

In the top gate method, however, not only the structure of a molding die used is complicated, but also it is necessary that an area (air vent) for discharging the air remaining in a cavity of the molding die to the exterior of the cavity be provided around the semiconductor chip. Consequently, it is required to widen the distance between the semiconductor chip and the lands arranged around the semiconductor chip, thus making the reduction in size of the semiconductor device difficult.

In view of this point the present inventors have made a study about such a method as is disclosed in Patent Document 2 wherein conductor members (conductor posts) are formed beforehand on substrate lands and are covered with resin, then a portion of the resin is removed, thereby allowing the conductor members to be exposed partially from the resin and making electrical coupling to the electronic part mounted on the upper or lower package.

However, in the case of the method disclosed in Patent Document 2, the surfaces of the conductor members exposed from the resin become level with the front surface of the sealing body formed in the resin sealing step. In this connection, it has turned out that in case of mounting another package on one package as in Patent Document 1, if the lower or upper package or both packages warp, external terminals of the upper package become difficult to be coupled with the conductor members formed on the lower package, with a consequent fear that there may occur an uncoupled portion.

A countermeasure may be forming large (high, thick) the external terminals which are formed on the upper package. In this case, however, it becomes difficult to reduce the packaging height of the semiconductor device.

Moreover, when mounting the upper package onto the lower package, if the conductor members (electrodes) coupled to the external terminals (electrodes) of the upper package are level with the front surface of the sealing body, in other words, if the front surface of the sealing body including the conductor members exposed from the sealing body is a flat surface, it becomes difficult of effect alignment of electrodes with each other.

The present invention has been accomplished in view of the above-mentioned problems and it is an object of the invention to provide a technique able to reduce the size of a semiconductor device.

It is another object of the present invention to provide a technique able to improve the reliability of a semiconductor device.

It is a further object of the present invention to provide a technique able to thin a semiconductor device.

The above and other objects and novel features of the present invention will become apparent from the following description and the accompanying drawings.

The following is a brief description of a typical invention out of the inventions disclosed herein.

A method for manufacturing a semiconductor device according to one embodiment of the present invention comprises the steps of:

(a) providing a wiring substrate, the wiring substrate including a main surface, a plurality of bonding leads formed over the main surface, and a plurality of first lands formed on a peripheral edge portion side of the main surface with respect to the bonding leads, (b) disposing a plurality of second conductive members over the first lands respectively of the wiring substrate, (c) mounting a first semiconductor chip over the main surface of the wiring substrate, the first semiconductor chip including a main surface and a plurality of electrode pads formed over the main surface, (d) coupling the electrode pads of the first semiconductor chip and the bonding leads of the wiring substrate electrically with each other through a plurality of first conductive members, (e) sealing the first semiconductor chip and the second conductive members with resin to form a sealing body, (f) after the step (e), removing a part of the sealing body in such a manner that the second conductive members are each exposed partially, and (g) after the step (f), causing the second conductive members to project each partially from a front surface of the sealing body.

The following is a brief description of an effect obtained by the typical invention out of the inventions disclosed herein.

It is possible to reduce the size of a semiconductor device.

BRIEF DESCRIPTION OF THE DRAWINGS

FIG. 32 is a sectional view showing a third modification of the semiconductor device shown in FIG. 1.

DETAILED DESCRIPTION OF THE PREFERRED EMBODIMENTS

Figure 1:
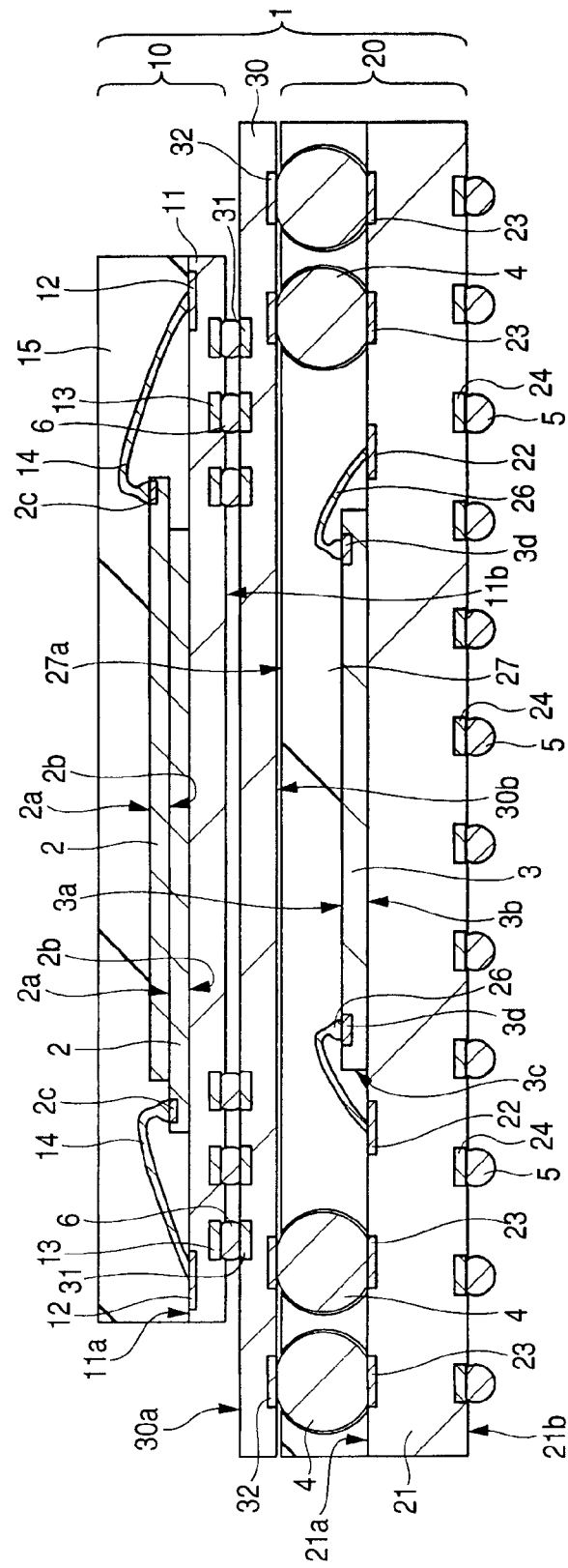
FIG. 1 is a sectional view showing an entire structure of a semiconductor device according to an embodiment of the present invention.

Description Form, Basic Terms, and How to Use, in the Present Invention

An embodiment of the present invention may be described dividedly into plural sections or the like where required for the sake of convenience, but unless otherwise mentioned, it is to be understood that the divided sections are not independent of each other, but constitute portions of a single example, or are in a relation such that one is a partial detail of the other or a modification of part or the whole of the other irrespective of the order of description. As to similar portions, repeated explanations thereof are mitted in principle. Constituent elements in an embodiment are not essential unless otherwise mentioned and except the case where they are limited theoretically to specified numbers thereof, further, except the case where they are clearly essential contextually.

Likewise, in the description of an embodiment or the like, as to "X comprising A" or the like with respect to material or composition, selection of any other element than A as one of principal constituent elements is not excluded unless otherwise mentioned and except the case where an opposite answer is evident contextually. For example, as to component, by the above description is meant "X containing A as a principal component." For example, "silicon member" is not limited to pure silicon, but it goes without saying that the silicon member in question covers SiGe (silicon germanium) alloy, other multi-element alloys containing silicon as a principal component, and those containing silicon and other additives. Moreover, "gold plating," "Cu layer," and "nickel plating,"

are not limited to pure ones, but include members containing gold, Cu, and nickel, respectively, as principal components, unless otherwise mentioned.

Further, when reference is made to a specific numerical value or quantity, a numerical value larger or smaller than the specific numerical value will also do unless otherwise mentioned and except the case where limitation is made to the specific numerical value theoretically, further, except the case where a negative answer is evident contextually.

First Embodiment

In this embodiment, as an example of a semiconductor device having stacked thereon a plurality of wiring substrates with electronic parts on board respectively, reference will be made to a POP type semiconductor device (hereinafter referred to simply as POP) having a plurality of semiconductor packages stacked thereon.

For example, the POP is comprised of a wiring substrate (base member) with a memory chip (semiconductor chip) on board and another wiring substrate (base member) with a controller chip (semiconductor chip) on board, the controller chip being formed with a control circuit for controlling the memory chip. The wiring substrates are stacked and the upper and lower wiring substrates are coupled together electrically through conductive members or an interposer substrate. In this way the semiconductor chips (electronic parts) mounted on the wiring substrates respectively are coupled together electrically to configure a system. For example, through external terminals provided on a lower surface of the lower wiring substrate the POP is mounted onto a mother board (packaging substrate) or the like with an external electronic device mounted thereon.

On the other hand, as a semiconductor package of the type different from POP there is known a system in package (SIP) type semiconductor device (hereinafter referred to simply as SIP) wherein a plurality of semiconductor chips (e.g., a controller chip and a memory chip) are mounted on a single wiring substrate to configure a system within a single semiconductor package.

Since the POP is provided with plural wiring substrates, it is advantageous in that the quantity of signal lines can be increased as compared with an SIP of the same packaging area even upon increase in the number of I/O terminals of a controller chip as a result of multifunction of a system. In the POP, moreover, since chips are coupled together after being mounted on wiring substrates respectively, it becomes possible to determine a state of chip-to-wiring substrate coupling. This is effective in improving the yield of package assembly. It is also possible to flexibly cope with multifarious small lot production of systems in comparison with SIP.

<Outline of Structure of Semiconductor Device>

FIG. 1 is a sectional view showing an entire structure of a semiconductor device according to this first embodiment. In FIG. 1, a POP (semiconductor device) 1 is a stacked type package of a two-stage structure comprising a sub-package 10 with a memory chip 2 (electronic part, semiconductor chip) mounted thereon and a base package 20 disposed in a stacked fashion under the sub-package 10, the base package 20 having mounted thereon a microcomputer chip (electronic part, semiconductor chip, controller chip) 3 for controlling the memory chip 2.

In this embodiment, the base package 20 and the sub-package 10 are coupled together electrically through an interposer substrate (wiring substrate) 30 to configure a system. A detailed structure of each of the packages will be described below in order.

<Base Package>

Figure 2:
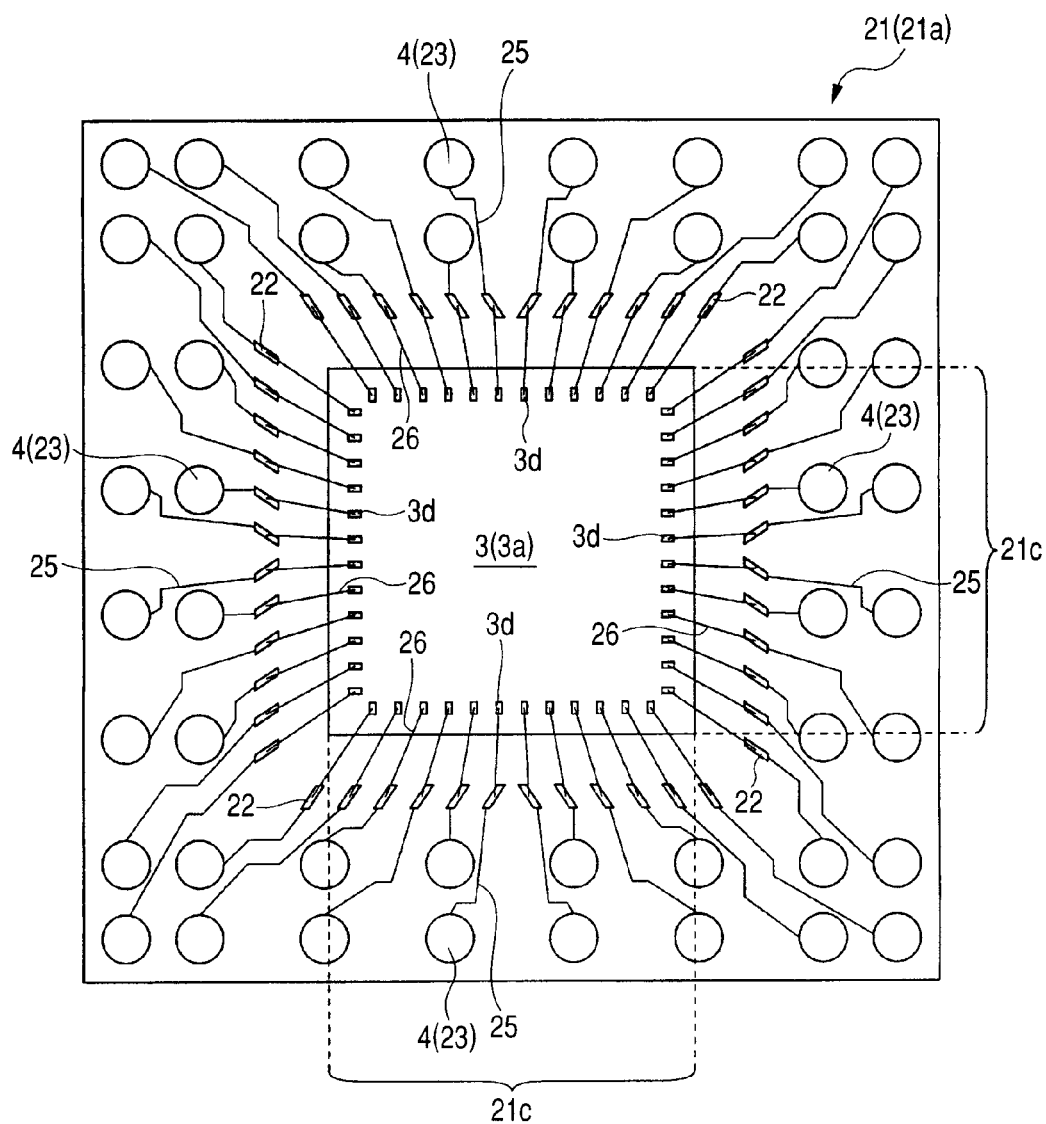
FIG. 2 is a perspective plan view showing an internal structure of a main surface side of a base package shown in FIG. 1.
Figure 3:
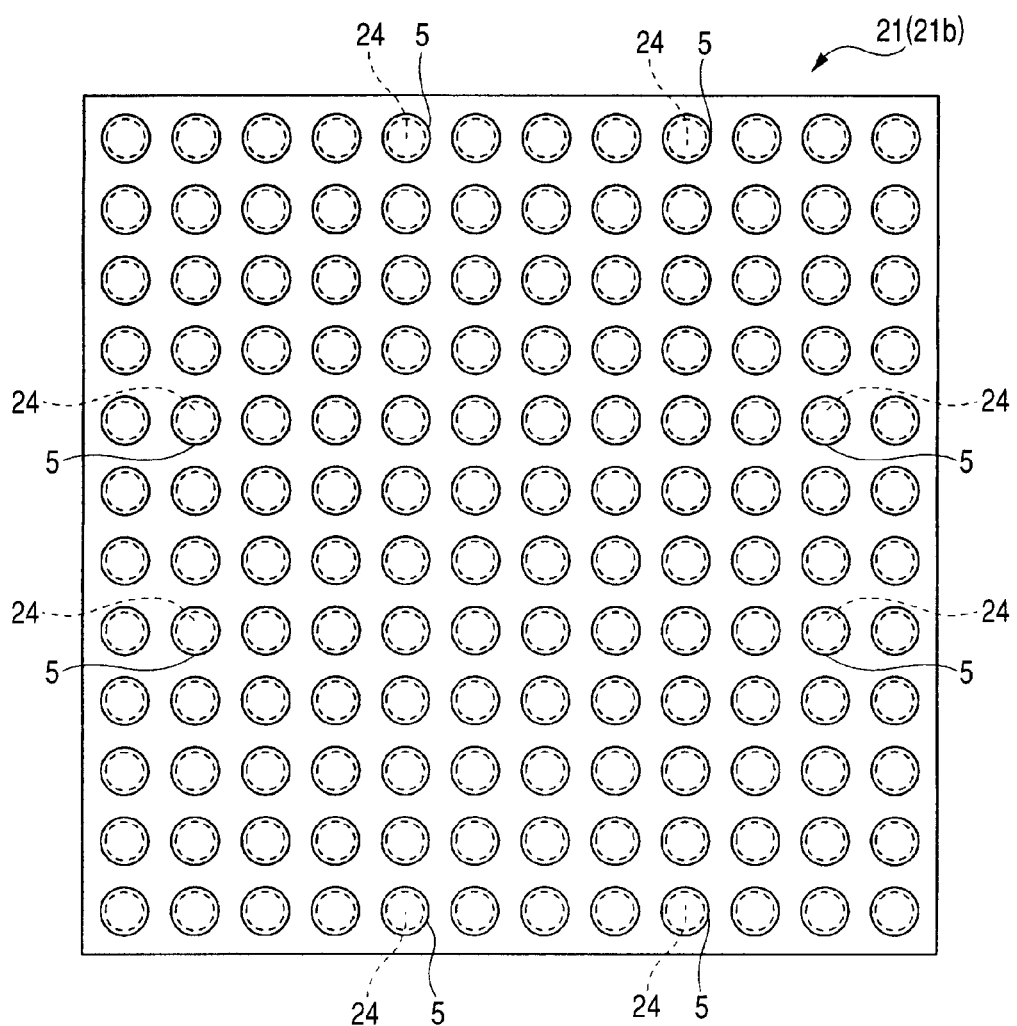
FIG. 3 is a plan view showing a back surface side of the base package shown in FIG. 1.

A description will now be given about the structure of the base package 20 shown in FIG. 1. FIG. 2 is a perspective plan view showing an internal structure of a main surface side of the base package shown in FIG. 1 and FIG. 3 is a plan view showing a back surface side of the base package shown in FIG. 1. FIG. 2 shows a removed state of sealing resin 27 shown in FIG. 1 in order to illustrate the arrangement of main surface-side members.

The base package 20 has a base substrate (wiring substrate, base member) 21. The base substrate 21 is a multilayered wiring substrate having four wiring layers (surface wiring layer, back surface wiring layer, and two inner wiring layers) and fabricated by for example a build-up method. An insulating layer for electrical insulation between adjacent wiring layers is formed for example by prepreg comprising resin-impregnated glass fiber or carbon fiber. The four wiring layers are each formed by a conductive film formed mainly by copper (Cu) for example. Illustrations of these wiring layers are omitted in FIG. 1. Only terminals 22 and lands 23 formed on a main surface 21a of the base substrate 21, as well as lands 24 for external I/O formed on a back surface 21b of the base substrate 21, are shown in FIG. 1.

As shown in FIG. 2, a planar shape of the main surface (surface, upper surface) 21a of the base substrate 21 is quadrangular and is square in this embodiment. On the main surface 21a of the base substrate 21 are formed a plurality of terminals (electrode pads, bonding leads) 22 and a plurality of wiring lines 25 coupled electrically to the terminals 22 respectively. Further, a plurality of lands (electrode pads, main surface-side lands) 23 are formed on the main surface 21a, the lands 23 being coupled electrically to the terminals 22 though the wiring lines 25. On the main surface 21a, the terminals 22 are arranged around a chip mounting area 21c (that is, around the microcomputer chip 3). In this embodiment, plural terminals 22 are arranged along each side of the microcomputer chip 3 which has a quadrangular plane shape. The lands 23 are arranged on a peripheral edge portion side of the main surface 21a with respect to the terminals 22, that is, outside the terminals 22 in relation to the microcomputer chip 3. In this embodiment, the lands 23 are arranged plurally along each side of the main surface 21a of the base substrate 21 which is quadrangular in planar shape. Plural bump electrodes (conductive members, ball electrodes, solder balls) 4 are bonded to the lands 23 respectively. The base substrate 21 and the interposer substrate 30 are coupled together electrically through the bump electrodes 4. That is, the bump electrodes 4 serve as substrate-to-substrate conduction paths which provide an electrical coupling between stacked substrates. As to the details of the bump electrodes 4, it will be described later.

On the other hand, the back surface (packaging surface, lower surface) 21b, which is positioned on the side opposite to the main surface 21a of the base substrate 21, has a quadrangular plane shape as shown in FIG. 3. For example, in this embodiment, it is a square equal in size to the main surface 21a. On the back surface 21b are formed plural lands (electrode pads, back surface-side lands) 24, which are arranged in a matrix shape for example. The lands 24 are coupled electrically through a wiring layer (not shown) of the base substrate 21 to the terminals 22 or lands 23 formed on the main surface 21a. A plurality of solder balls (external terminals) 5, which serve as a bonding material at the time of mounting the POP 1 onto a packaging substrate (not shown), are arranged (bonded) onto the lands 24 respectively.

The bump electrodes 4 and solder balls 5 used in this embodiment are each formed by so-called lead-free solder substantially containing no Pb (lead). For example, they are each formed by only Sn (tin), Sn (tin)-Bi (bismuth), or Sn (tin)-Ag (silver)-Cu (Copper). By the lead-free solder is meant solder having a lead (Pb) content of not higher than 0.1 wt %. This content is defined as a standard of RoHs (Restriction of Hazardous Substances) Instructions. In the following description of this embodiment, when reference is made to solder or solder balls, the solder indicates lead-free solder unless otherwise mentioned.

The microcomputer chip 3 is mounted in the chip mounting area 21c on the main surface 21a of the base substrate 21. As shown in FIG. 1, the microcomputer chip 3 includes a main surface 3a, a back surface 3b positioned on the side opposite to the main surface 3a, and side faces 3c positioned between the main surface 3a and the back surface 3b. The main surface 3a and the back surface 3b are each quadrangular in planar shape, for example, square in this embodiment.

A plurality of semiconductor elements such as transistors and diodes are formed on the main surface 3a of the microcomputer chip 3. The semiconductor elements are coupled together electrically through wiring lines (intra-chip wiring lines) (not shown) to configure an integrated circuit. On the main surface 3a are formed a plurality of pads (electrode pads) 3d along the sides which configure outer edges of the main surface 3a, the pads 3d being coupled to the integrated circuit electrically. The pads 3d are arranged so as to surround the circuit-forming area where the integrated circuit is formed, and are coupled to the integrated circuit electrically through the intra-chip wiring lines.

As shown in FIG. 1, the microcomputer chip 3 is fixed onto the base substrate 21 through an adhesive (not shown) by a so-called face-up mounting method so that the back surface 3b thereof confronts the main surface 21a of the base substrate 21.

The pads 3d formed on the main surface 3a of the microcomputer chip 3 are coupled electrically through a plurality of wires (conductive members) 26 formed of for example gold (Au) to the terminals 22 respectively formed on the main surface 21a of the base substrate 21.

Sealing resin (sealing body) 27 is disposed between the main surface 21a of the base substrate 21 and a back surface 30b of the interposer substrate 30. The microcomputer chip 3 and the wires 26 are sealed with the resin 27. The bump electrodes 4 as terminals for electrical coupling between substrates are exposed from the sealing resin 27 on a front surface (upper surface, main surface) 27a of the sealing resin 27, as shown in FIG. 1.

<Sub-Package>

Figure 4:
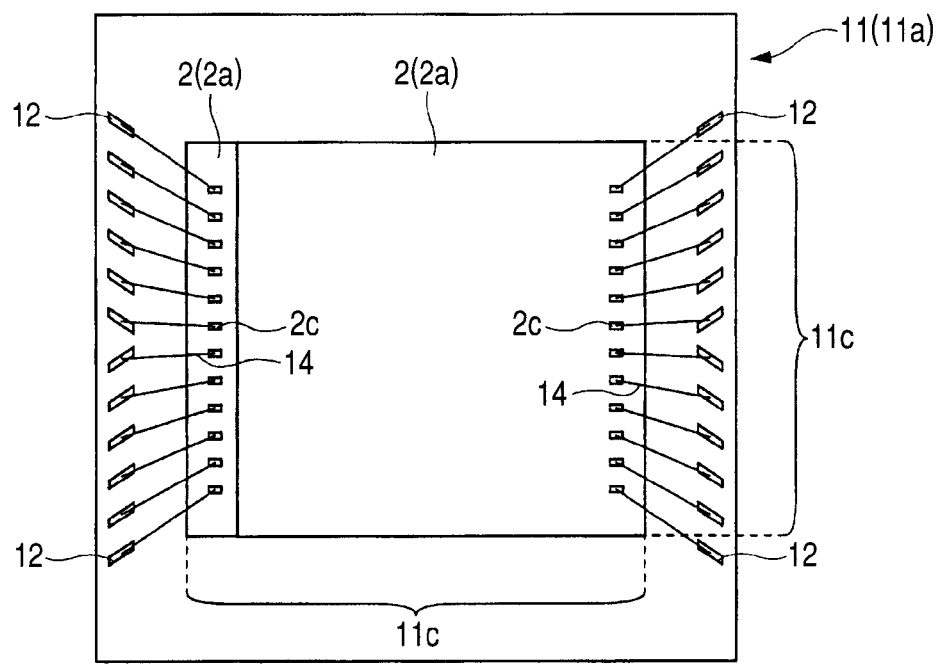
FIG. 4 is a plan view showing a main surface side of a sub-substrate shown in FIG. 1.
Figure 5:
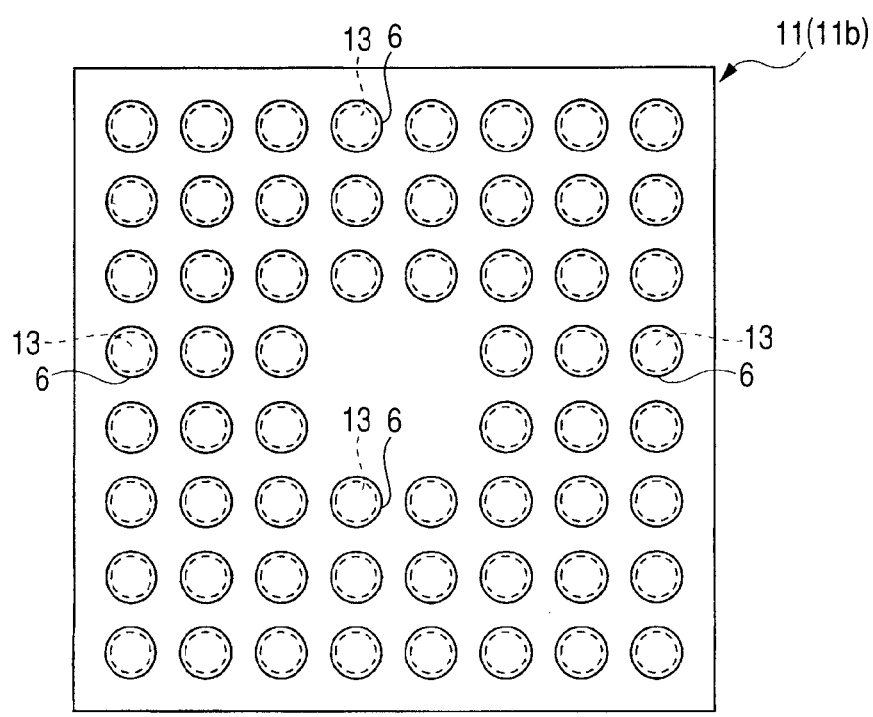
FIG. 5 is a plan view showing a back surface side of the sub-substrate shown in FIG. 1.

The following description is now provided about the structure of the sub-package 10 shown in FIG. 1. FIG. 4 is a plan view showing a main surface side of the sub-package shown in FIG. 1 and FIG. 5 is a plan view showing a back surface side of the same sub-package.

The sub-package 10 has a sub-substrate 11. The sub-substrate 11 is, for example, a resin substrate having a glass fabric-based epoxy resin layer as an insulating layer. As shown in FIG. 4, a main surface (surface, upper surface) 11a of the sub-substrate 11 is quadrangular in planar shape, for example, a square smaller than the main surface 21a of the base substrate 21 shown in FIG. 2. A plurality of terminals (bonding leads, electrode pads) 12 are formed on the main surface 11a of the sub-substrate 11. A chip mounting area 11c as an area for mounting the memory chip 2 is disposed nearly centrally of the main surface 11a. The terminals 12 are formed on the peripheral edge portion side with respect to the chip mounting area 11c, as shown in FIG. 4.

A plurality of lands (terminals, electrode pads) 13 serving as external terminals (interfacing terminals) of the sub-package 10 are formed on a back surface (packaging surface, lower surface) 11b which is positioned on the side opposite to the main surface 11a. For example, as shown in FIG. 5, the lands 13 are arranged in a matrix shape. The lands 13 are coupled electrically through wiring lines (not shown) to the main surface 11a of the sub-substrate 11. A plurality of solder balls 6, which serve as a bonding material when mounting the sub-package 10 onto the interposer substrate 30, are disposed (bonded) onto the lands 13 respectively.

As shown in FIG. 1, the thickness of the base substrate 21 is larger than that of the sub-substrate 11. The base substrate is a substrate having external terminals of the POP 1. For distribution of a large number of wiring lines it is necessary to ensure a wiring distribution space wider than the sub-substrate 11. To meet this requirement, the base substrate 21 is formed with, say, four or more wiring layers, thereby ensuring a wiring distribution space while suppressing increase of a plane area. Therefore, an increase of thickness results. On the other hand, as to the sub-substrate 11, since it is a substrate mounted on the base substrate 21, the wiring distribution space can be made smaller than in the case of the base substrate 21. Thus, the sub-substrate 11 is smaller in the number of wiring layers than the base substrate 21. For example, in this embodiment, there is used a wiring substrate of a two-layer structure having one wiring layer on each of the main surface 11a side and the back surface 11b side.

The memory chip 2 is mounted in the chip mounting area 11c of the main surface 11a. In this embodiment there is shown an example in which plural (two) memory chips 2 are mounted in a stacked state. As shown in FIG. 1, each memory chip 2 has a main surface 2a and a back surface 2b positioned on the side opposite to the main surface 2a, both being quadrangular in planar shape. In this embodiment, each memory chip 2 is mounted on the sub-substrate 11 by a so-called face-up mounting method so that the back surface 2b confronts the main surface 11a of the sub-substrate 11.

A memory circuit called memory array is formed on the main surface 2a of each memory chip 2 and is coupled electrically to plural pads (electrode pads) 2c formed on the main surface 2a. The memory capacity of the memory chip 2 is correlated with the area of the memory cell array. Generally, the larger the area of the main surface 2a, the larger the memory capacity. However, from the standpoint of reducing the size of the POP 1 or the sub-package 10, it is preferable to decrease the area of the main surface 2a. In this embodiment, therefore, plural memory chips 2 are stacked to reduce the size of the sub-package 10 or the POP 1 while ensuring the required memory capacity.

A memory type semiconductor chip such as the memory chip 2 is smaller in the required number of terminals than a controller type semiconductor chip formed with an arithmetic processing circuit or a control circuit like the microcomputer chip 3. Therefore, the pads 2c are arranged along one side out of the sides of the main surface 2a. The pads 2c are coupled electrically to the terminals 12 respectively through a plurality of wires formed of gold (Au) for example. In this connection, for the standpoint of shortening the distance of coupling by the wires 14, the terminals 12 are arranged along the side on which the pads coupled to the terminals 12 through the wires 14 are arranged. Although plural memory chips 2 are mounted in this embodiment, the pads 2c of the lower memory chip 2 and the pads 2c of the upper memory chip 2 are arranged along different sides, whereby it is possible to prevent the wires 14 from becoming complicated in loop shape and causing short-circuit with each other.

Sealing resin (sealing body) 15 is disposed (formed) on the main surface 11a of the sub-substrate 11 and the memory chips 2 and wires 14 are sealed with the sealing resin 15.

<Interposer Substrate>

Figure 6:
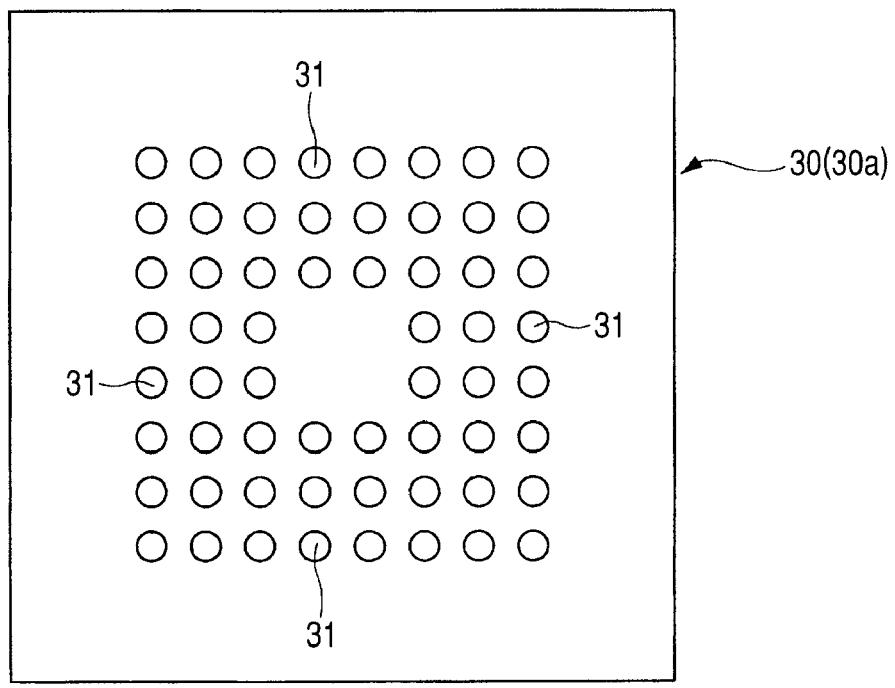
FIG. 6 is a plan view showing a main surface side of an interposer substrate shown in FIG. 1.
Figure 7:
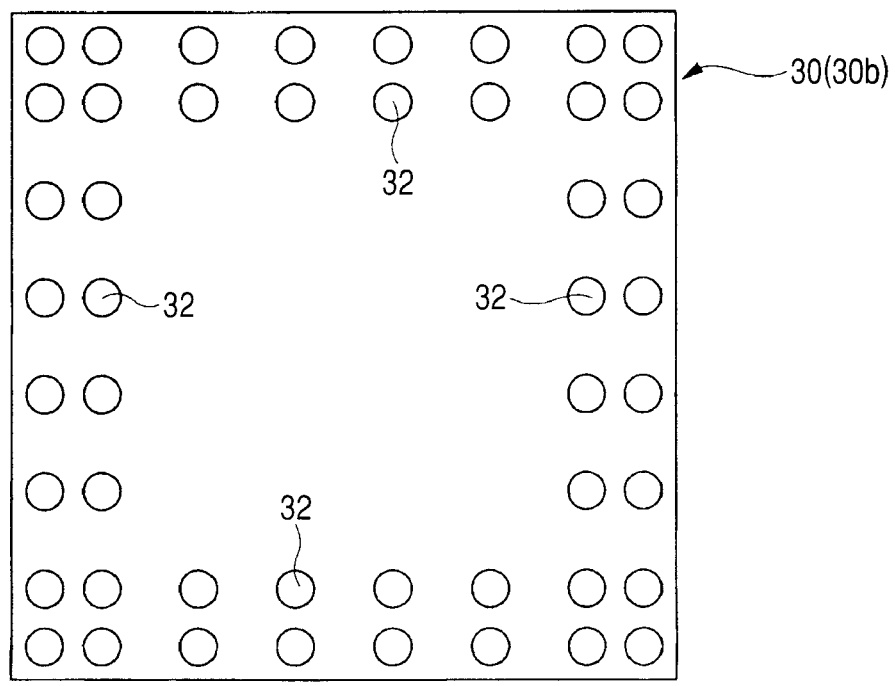
FIG. 7 is a plan view showing a back surface side of the interposer substrate shown in FIG. 1.

Next, a description will be given below about the structure of the interposer substrate 30 shown in FIG. 1. FIG. 6 is a plan view showing a main surface side of the interposer substrate shown in FIG. 1 and FIG. 7 is a plan view showing a back surface side of the same interposer substrate.

For example, the interposer substrate 30 is a resin substrate having a glass fabric-based epoxy resin layer as an insulating layer. As shown in FIG. 4 or FIG. 5, a main surface (surface, upper surface) 30a and a back surface (lower surface) 30b of the interposer substrate are each quadrangular in planar shape, for example, a square of the same size as the main surface 21a of the base substrate 21 shown in FIG. 2.

On the main surface 30a are formed a plurality of lands (terminals, electrode pads, main surface-side lands, bonding leads) 31 at positions opposed to the positions of the terminals, i.e., lands 13 and solder balls 6, of the sub-package 10 mounted on the main surface 30a.

On the other hand, on the back surface 30b are formed a plurality of lands (electrode pads, back surface-side lands) 32 at positions opposed to the positions of the bump electrodes 4 which are substrate-to-substrate coupling terminals of the base package 20.

The lands 31 and 32 are electrically coupled together respectively through wiring lines (not shown) of the interposer substrate 30. As shown in FIG. 1, the lands 31 and 32 are bonded and electrically coupled to the solder balls 6 and the bump electrodes 4, respectively. That is, the base package 20 and the sub-package 10 are coupled together electrically through the interposer substrate 30.

The sub-package 10 and the base package 20 can be coupled together without interposition of the interposer substrate 30, provided the lands 13 of the sub-package 10 and the bump electrodes 4 of the base package 20 are located at mutually confronting positions. However, by electric coupling through the interposer substrate 30 as in this embodiment, packages having different terminal arrays can be coupled together electrically. That is, the degree of freedom in the design of each package is improved. For example, as in this embodiment, even in the case of plural packages having respective wiring substrates with main surfaces different in planar dimensions, they can be coupled together easily. In this embodiment, since the interposer substrate 30 is for coupling packages different in terminal array electrically with each other, it is a wiring substrate of a two-layer structure having wiring layers on the main surface 30a and the back surface 30b respectively. Therefore, the thickness of the interposer substrate 30 is smaller than that of the base substrate 21, as shown in FIG. 1.

Figure 8:
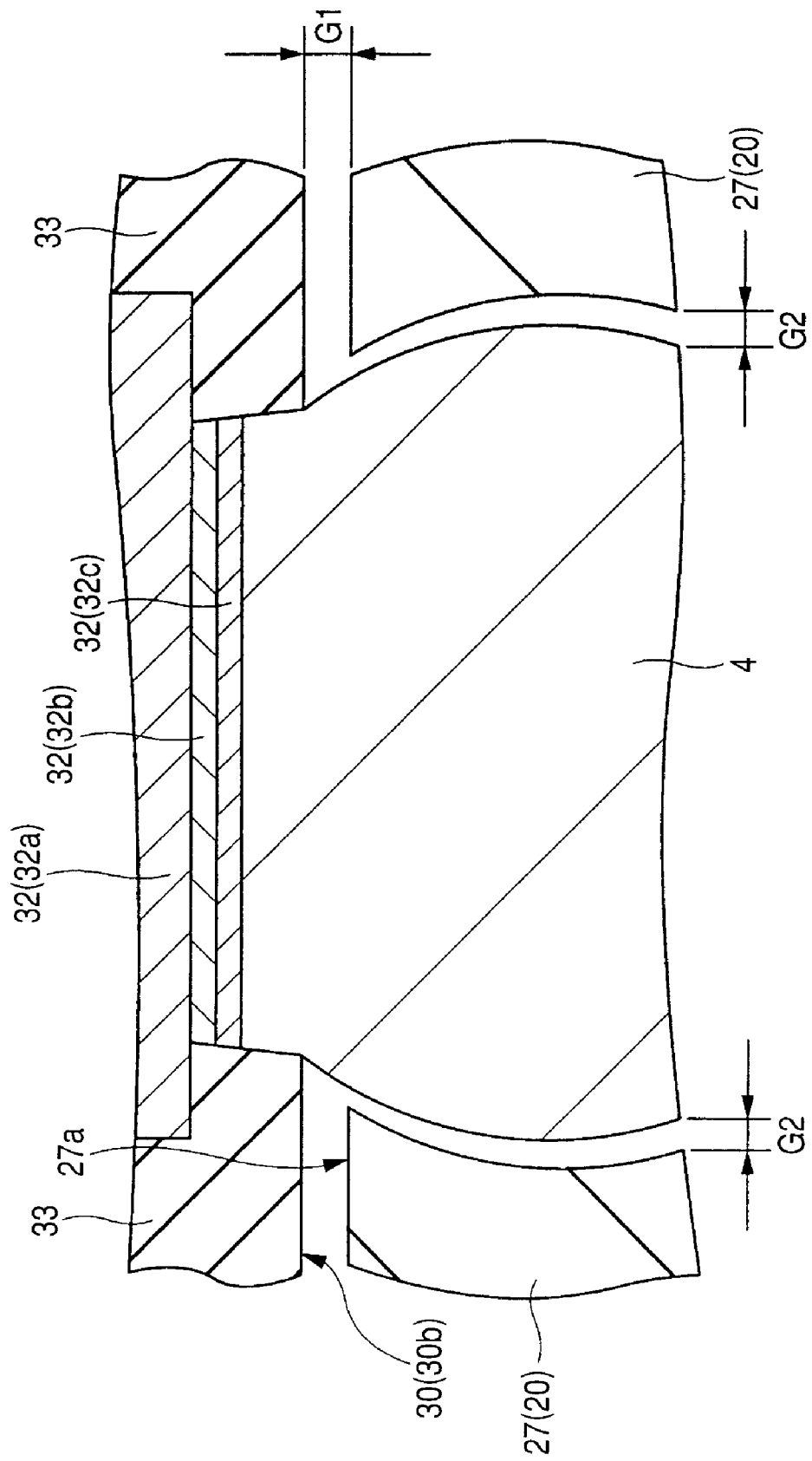
FIG. 8 is an enlarged sectional view of a principal portion, showing a detailed structure of the back surface of the interposer substrate shown in FIG. 1 and a surface of sealing resin.

The back surface 30b of the interposer substrate 30 and the front surface 27a of the sealing resin 27 of the base package 20 are not adhesively fixed to each other. FIG. 8 is an enlarged sectional view of a principal portion, showing a detailed structure of the back surface of the interposer substrate shown in FIG. 1 and the front surface of the sealing resin. FIG. 8 shows an example in which the back surface 30b of the interposer substrate 30 is covered with a solder resist film (insulating film) 33 and the lands 32 are exposed in apertures formed in the solder resist film 33. Further, as an example of a detailed structure of each land 31 there is shown in the same figure a structure wherein a plating film comprising a nickel (Ni) film 32b and a gold (Au) film is laminated onto a surface of a land body 32a formed of copper (Cu) for example.

In case of disposing another wiring substrate onto the package covered with the sealing resin, it may be effective to adopt a method wherein the front surface of the sealing resin and the back surface of the upper wiring substrate are fixed to each other strongly through an adhesive.

However, according to a study made by the present inventors it has turned out that the following problem occurs if the upper wiring substrate and the front surface of the sealing resin of the lower package are fixed together adhesively. This point will be described below while making reference to the POP 1 of this embodiment.

During manufacture or after completion of such a semiconductor device as the POP 1, various heat cycles (heating/cooling temperature cycles) are applied to the POP 1. In the case where the front surface 27a of the sealing resin 27 and the back surface 30b of the interposer substrate 30 are fixed to each other adhesively, stress is induced due to a difference in the coefficient of linear expansion between the sealing resin 27 and the interposer substrate. This stress acts on both base package 20 and interposer substrate 30, causing deformation (warping) of the substrate (package) or destruction of the bump electrodes 4 as substrate-to-substrate coupling terminals.

In view of this point, according to this embodiment, as shown in FIG. 8, the front surface 27a of the sealing resin 27 and the back surface 30b of the interposer substrate 30 are disposed through a gap G1. More specifically, the gap G1 is formed between the solder resist film 33 which covers the back surface 30b of the interposer substrate 30 and the front surface 27a of the sealing resin 27. In other words, the front surface 27a of the sealing resin 27 and the back surface 30b of the interposer substrate 30 (solder resist film 33) are spaced from each other. More particularly, the height (thickness) of each bump electrode 4 is larger than that of the sealing resin 27 and the bump electrodes 4 each project partially from the front surface 27a of the sealing resin 27. Therefore, the interposer substrate 30 and the base package 20 are fixed together by the bump electrodes 4, while the other portions than the bonded portions of the bump electrodes 4 and the lands 31 in the apertures of the solder resist film 33 are not fixed. In other words, the interposer substrate 30 is supported by the bump electrodes 4.

Accordingly, even when heat cycles are applied to the POP 1 during manufacture or after completion of the POP 1, it is possible to prevent or suppress the occurrence of stress due to a difference in the coefficient of linear expansion between the sealing resin 27 and the interposer substrate. Consequently, it is possible to prevent deformation (warping) of the substrate (package) and destruction of the bump electrodes 4 which are substrate-to-substrate coupling terminals, and hence possible to improve the reliability of the POP 1.

In this embodiment, the bump electrodes 4 and the sealing resin 27 are disposed though a gap G2. In other words, the bump electrodes 4 and the sealing resin 27 are spaced from each other. By thus disposing the bump electrodes 4 and the sealing resin 27 through the gap G2 it is possible to prevent or suppress the occurrence of stress caused by a difference in the coefficient of linear expansion between the bump electrodes 4 and the sealing resin 27 even when heat cycles are applied to the POP 1.

By forming the sealing resin 27 spacedly from both interposer substrate and bump electrodes 4 as in this embodiment it becomes easier to discharge impurities, e.g., water, getting into the POP 1 during manufacture or after completion of the POP. Therefore, from the standpoint of preventing or suppressing for example the destruction of the bump electrodes 4 caused by such impurities (especially water), it is preferable that the gaps G1 and G2 serving as impurity discharge paths be formed as in this embodiment.

From the above standpoint of preventing the occurrence of stress there is no special limitation insofar as the sealing resin 27 and the interposer substrate 30 (or bump electrodes 4) are not fixed to each other. Even when the back surface 30b of the interposer substrate 30 (or bump electrodes 4) and the sealing resin 27 are partially in contact with each other, it is possible to prevent or suppress the occurrence of stress.

On the other hand, from the standpoint of facilitating the foregoing discharge of impurities such as water it is preferable that the back surface 30b of the interposer substrate 30 (or bump electrodes 4) and the sealing resin 27 be not in contact with each other. This is because obstacles present within the discharge paths are to be removed as much as possible when using the gaps G1 and G2 as impurity discharge paths.

As to the method of disposing the sealing resin 27 and the interposer substrate 30 (or bump electrodes 4) spacedly from each other as in FIG. 8, a detailed description will be given later at the time of explaining the manufacturing method for the POP 1.

<Semiconductor Device Manufacturing Method>

A description will now be given about how to manufacture the semiconductor device according to this embodiment. First, the semiconductor device manufacturing method according to this embodiment will be described with reference to FIG. 1. The semiconductor device manufacturing method according to this embodiment includes a base member providing step for providing a base member corresponding to the base substrate 21, a die bonding step of mounting a microcomputer chip 3 onto a main surface 21a of the base member corresponding to the base substrate 21, a bump electrode forming step of disposing bump electrodes 4 on a plurality of lands 23 of the base substrate 21, a wire bonding step of coupling a plurality of pads 3d of the microcomputer chip 3 and a plurality of terminals 22 of the base substrate 21 electrically with each other through a plurality of wires 26, a sealing step of sealing the microcomputer chip 3 and the bump electrodes 4 with resin and forming sealing resin 27, a bump electrode exposing step of, after the sealing step, removing a part of the sealing resin 27 so that the bump electrodes 4 are each partially exposed, a bump electrode protruding step of, after the bump electrode exposing step, protruding the bump electrodes 4 each partially from a front surface of the sealing resin 27, a base member stacking step of, after the bump electrode protruding step, providing a base member corresponding to the interposer substrate 30 and stacking it onto the front surface of the sealing resin, a ball mounting step of mounting solder balls 5 on a back surface side 21b of the base member corresponding to the base substrate 21, a package dicing step of cutting off the base member corresponding to the base substrate 21 and the base member corresponding to the interposer substrate 30 in a mounted state of the latter onto the former to afford an individual package, and a sub-package mounting step of providing a sub-package 10 and mounting it onto the main surface 30a of the interposer substrate 30.

In the semiconductor device manufacturing method according to this embodiment, the microcomputer chip 3 and the bump electrodes 4 are sealed in the sealing step. In the sealing step, therefore, sealing can be effected by adopting the so-called side gate method wherein sealing resin is supplied from a side face 3c side of the microcomputer chip 3. In the side gate method, an air vent can be provided on the side opposite to a gate which shares the sealing resin. Therefore, in comparison with the semiconductor device wherein a sealing body is formed by adopting such a top gate method as shown in FIG. 7 of Patent Document 1, the microcomputer chip 3 and the lands 23 arranged around the chip can be approximated to each other. That is, a planar size of the main surface 21a can be reduced. Moreover, in the case of the side gate method, it is not necessary to change a molding die 42 even if the size of the semiconductor device (a planar size of the main surface 21a of the base substrate 21) is changed. In other words, a sealing body can be formed by using a common molding die 41. Thus, the semiconductor device can be manufactured without making a new equipment investment and hence it is possible to reduce the manufacturing cost.

In the semiconductor device manufacturing method according to this embodiment, the bump protruding step is carried out before the base member stacking step. That is, the bump electrodes 4 are projected from the front surface 27a of the sealing resin 27 in advance before coupling the lands 32 formed on the base member corresponding to the interposer substrate 30 and the bump electrodes 4 electrically with each other.

Therefore, in the base member stacking step, even if a warp occurs in either the base member corresponding to the interposer substrate 30 or the base member corresponding to the base substrate 21, or both, all the lands 32 can be bonded to the bump electrodes 4 positively.

Moreover, since the lands 32 as terminals of the interposer substrate 30 can be bonded to the bump electrodes 4 even without forming a thick bonding material on the surfaces of the lands 32, it is possible to thin the POP 1, that is, the packaging height of the semiconductor device can be reduced.

Further, by disposing the base member corresponding to the interposer substrate 30 in a projected state of the bump electrodes 4, it is possible to effect alignment of the lands 31 and the bump electrodes 4 easily.

The details of each of the steps included in the semiconductor device manufacturing method according to this embodiment will be described in order below.

Figure 9:
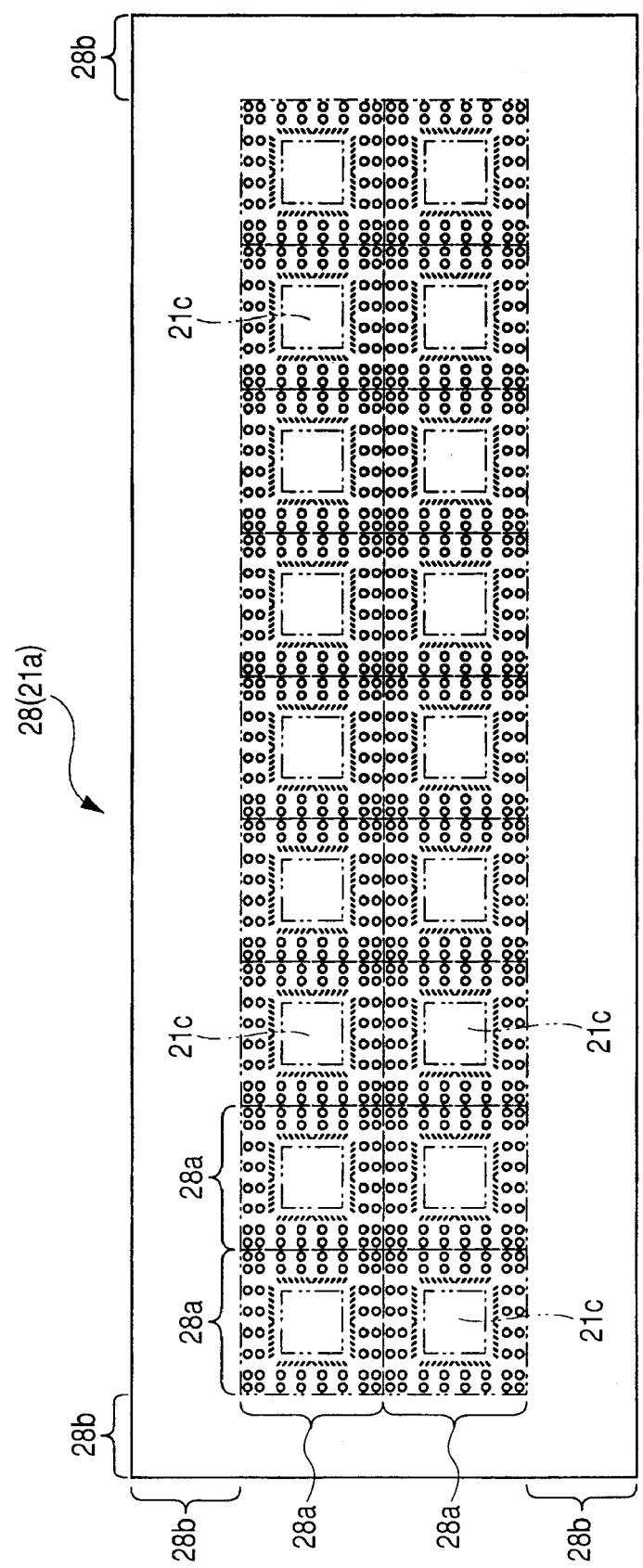
FIG. 9 is a plan view showing an entire structure of a main surface of a wiring substrate provided in a base member providing step.

First, in the base member providing step, there is provided a base member corresponding to the base substrate 21 shown in FIGS. 1 to 3. FIG. 9 is a plan view showing an entire structure of a main surface of a wiring substrate provided in the base member providing step.

As shown in FIG. 9, the base substrate (base member, wiring substrate, multi-package wiring substrate) 28 provided in this step is a matrix substrate (a multi-package substrate) with a plurality of product-forming areas 28a arranged for example in a matrix shape. Each of the product-forming areas 28a on the base substrate 28 corresponds to the base substrate 21 shown in FIG. 21. The base substrate 28 has frame portions 28b which surround the product-forming areas 28a. That is, on the plane of the main surface 21a or the back surface 21b, the product-forming areas 28a are located inside the frame portions 28b.

The terminals 22, wiring lines 25 and lands 23 arranged around the chip mounting area 21c of the main surface (surface, upper surface) 21a, as well as the lands 24 disposed on the back surface (packaging surface, lower surface) 21b, which have been described above in connection with FIGS. 1 to 3, are formed beforehand in each of the product-forming areas 28a of the base substrate 28. The lands 24 are coupled to the lands 23 or terminals 22 electrically through wiring lines 25.

Figure 10:
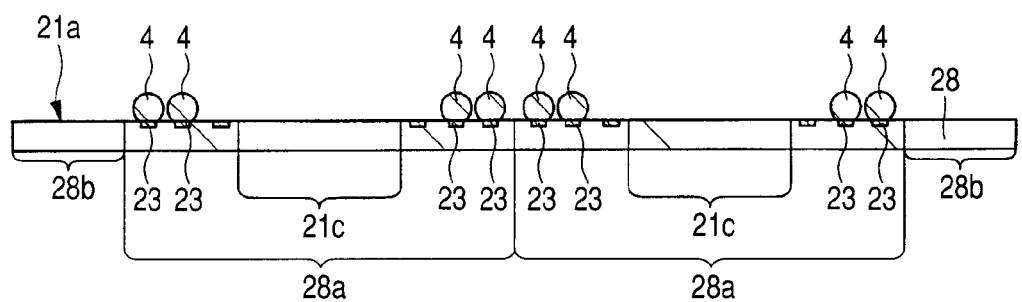
FIG. 10 is a sectional view showing a state in which bump electrodes were formed on lands of a base substrate shown in FIG. 9.

In the bump electrode forming step, bump electrodes 4 are disposed and electrically coupled respectively onto lands 23 of the base substrate 21. FIG. 10 is a sectional view showing a state in which bump electrodes are formed on lands of the base substrate shown in FIG. 9.

In this step, a plurality of bump electrodes 4 are formed and coupled respectively onto a plurality of lands 23 formed on the main surface 21a of the base substrate 28. In this embodiment, solder balls are used as the bump electrodes 4. In connection with bonding the solder balls as bump electrodes 4 and the lands 23 with each other, for example a flux material having a function of improving the surface activity of the solder balls is disposed beforehand on the lands and in this state the bump electrodes 4 are disposed and heat-treated. Since the flux material functions to improve the surface activity of the metal to be bonded, also functions to remove a surface oxide film and prevent re-oxidation, the solder balls and the lands 23 can be bonded with each other in an easy and positive manner.

In case of using the flux material, in order to remove a residue (flux residue) derived from the flux material it is necessary that the bonded portion be subjected to washing after the bonding between the bump electrodes 4 and the lands 23. For example, the washing is performed by spraying pressurized washing water to the bonded portion. In the case where a wire bonding step to be described later is performed before this bump electrode forming step, if pressurized washing water strikes against a wire, the wire may be deformed by that pressure.

In this connection, according to this embodiment, the bump electrodes 4 are formed in advance, whereby the flux material can be removed easily without deformation of the wires even in case of bonding the bump electrodes 4 and the lands 23 with each other through the flux material. In the heat treatment for bonding the bump electrodes 4 and the lands 23 with each other, the base substrate 28 is conveyed to a reflow furnace for heat treatment in a state in which the solder balls serving as bump electrodes are disposed on the lands 23 of the base substrate 28. Thus, also from the standpoint of preventing the occurrence of deformation and breaking of wires during conveyance to the reflow step, it is preferable that this bump electrode forming step be performed before the wire bonding step.

Moreover, performing the bump electrode forming step before the die bonding step is advantageous in that the expensive microcomputer chip 3 need not be discarded in the event of occurrence of a defect in the bump electrode forming step.

Although in this embodiment the base member providing step and the bump electrode forming step have been described separately from each other, the bump electrodes 4 may be formed beforehand on the surfaces of the lands 23 of the base substrate 28 which is provided in the base material providing step described above.

Figure 11:
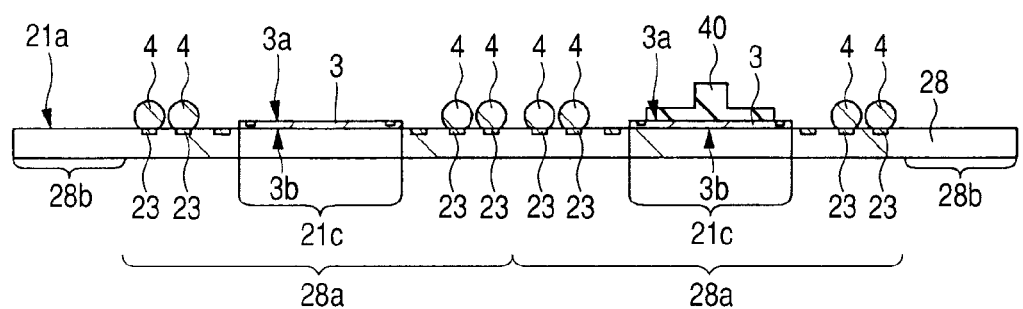
FIG. 11 is a sectional view of a principal portion, showing a state in which semiconductor chips are mounted on the base substrate shown in FIG. 10.
Figure 12:
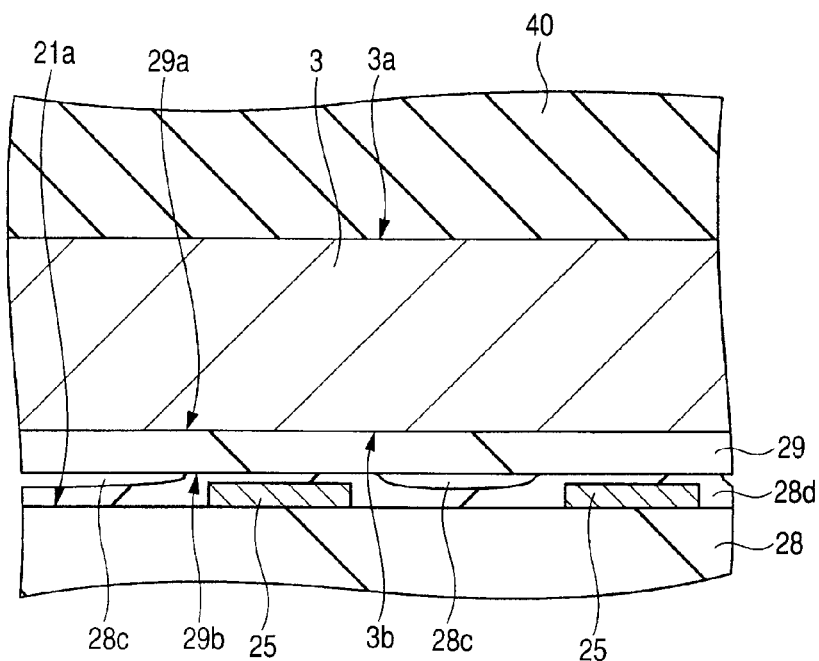
FIG. 12 is an enlarged sectional view showing on a larger scale a semiconductor chip and the vicinity thereof shown in FIG. 11.

Next, in the die bonding step, a microcomputer chip 3 is mounted on a chip mounting area 21c in each of the product-forming areas 28a. FIG. 11 is a sectional view of a principal portion, showing a state in which semiconductor chips are mounted on the base substrate shown in FIG. 10 and FIG. 12 is an enlarged sectional view showing on a larger scale a semiconductor chip and the vicinity thereof shown in FIG. 11.

In this step, a microcomputer chip 3 is held with a collet 40, which is a semiconductor chip holding jig used in die bonding, and is disposed in this state onto the chip mounting area 21c of each product-forming area 28a. In this embodiment, since the microcomputer chip 3 is mounted by the face-up mounting method, the microcomputer chip 3 is disposed on the chip mounting area 21c in a state in which its back surface 3b confronts the main surface 21a of the base substrate 28. Next, with the back surface 3b of the microcomputer chip 3 opposed to the main surface 21a of the base substrate 28, the microcomputer chip 3 is fixed adhesively onto the base substrate 28 through an adhesive 29 (see FIG. 12).

As the adhesive 29 there may be used a pasty adhesive or a filmy one called DAF (Die Attach Film), but in this embodiment there is used an adhesive film (hereinafter referred to as DAF) having an adhesive layer on its surface 29a confronting the back surface 3b of the microcomputer chip 3 and further having an adhesive layer on its back surface 29b confronting the main surface 21a of the base substrate 28.

As the adhesive for bonding a semiconductor chip onto a wiring substrate there generally is used a pasty adhesive, but there is a case where the following problems arise with the recent tendency to a thinner and smaller structure of the semiconductor device. Firstly, as a result of thinning of a semiconductor chip, there is a fear of paste creeping up to the main surface of the semiconductor chip. Secondly, as a result of a pasty adhesive spreading excessively to the outside of the chip mounting area in the die bonding step, there is a fear that the surfaces of the terminals 22 may be stained.

In view of these problems, DAF is used as the adhesive 29 in this embodiment. The DAF can be affixed to the back surface 3b of the microcomputer chip 3 before taking out each diced microcomputer chip 3 from a semiconductor wafer. Therefore, a planar size of the adhesive 29 can be set approximately equal to the size of the back surface 3b of the microcomputer chip 3. Consequently, it is possible to prevent the adhesive 29 from lapping on the main surface 3a side of the microcomputer chip 3. Since there is no fear of the adhesive 29 spreading to the outside of the chip mounting area 21c, the terminals 22 and the chip mounting area 21c can be disposed close to each other. That is, by approximating the terminals 22 and the chip mounting area 21c (chip ends of the microcomputer chip 3) to each other, it is possible to reduce the planar size of the semiconductor device. Particularly, in the case of the POP type semiconductor device like this embodiment, shortening the distance between the terminals 22 and the chip mounting area 21c is very important from the standpoint of reducing the size because the lands 23 are arranged around the terminals 22.

In the case of a pasty adhesive, there sometimes is a case where the microcomputer chip 3 moves after the mounting thereof due to surface tension of the paste. However, with DAF, the microcomputer chip 3 can be mounted with a high positional accuracy because it is possible to prevent moving of the mounted microcomputer chip.

Also in case of using DAF, as is the case with a pasty adhesive, the adhesive 29 is cured and fixed after the mounting of the microcomputer chip 3. DAF can be broadly classified into two types, depending on timing of the curing.

Firstly, there is known a DAF of the type which is cured by baking after die bonding, thereby obtaining a final adhesive force. In this type, since DAF is cured in the die bonding step, the subsequent steps have no restrictions of a heating process. For example, this type is effective in case of mounting the bump electrodes 4 later than the die bonding step as in the foregoing modification.

Secondly, there is known a DAF of the type which goes through the steps from die bonding to sealing to be described later without being cured (heat-cured) and which is cured after the supply of sealing resin in the sealing step. This type of DAF is used in this embodiment.

As shown in FIG. 12, the surface of an insulating film (solder resist film) 28d which covers the main surface 21a of the base substrate 28 is not a completely flat surface, but is an uneven surface for example under the influence of wiring lines 25 formed on the main surface 21a. Therefore, in a state in which the microcomputer chip 3 was put onto the main surface 21a with use of the collet 40, a gap 28c is created between the back surface 29b of the adhesive 29 and the surface of the insulating film 28d.

In the case of the adhesive 29 of the type which is cured just after the above die bonding, there is a fear that the reflow resistance may be deteriorated, because the adhesive 29 cures in a remaining state of the gap 28c. On the other hand, in this embodiment, since the adhesive 29 is cured in the sealing step to be described later, the adhesive 29 can be pushed in so as to fill up the gap 28c by virtue of the sealing resin feed pressure. Consequently, it is possible to improve the adhesion between the adhesive 29 and the insulating film 29d.

In the case of DAF of the type not cured until the sealing step, there are restrictions in the heating step which is performed in the period after this die bonding step until the sealing step. More particularly, until the adhesive 29 comes into close contact with the insulating film 28d, it is impossible to apply heat whose temperature exceeds the curing temperature of the adhesive 29. In this embodiment, therefore, the bump electrode-forming step which requires heat treatment is completed before the sealing step to prevent curing of the adhesive 29.

In this embodiment the collet 40 holds a microcomputer chip 3 and places it onto the base substrate 28. It is a so-called flat collet which holds the main surface 3a of each microcomputer chip 3. More specifically, a hole for vacuum-chucking the microcomputer chip 3 is formed in the contact surface of the collet 40 for contact with the microcomputer chip 3, whereby the microcomputer chip 3 is chucked and held. End portions of the collet 40 are located inside the peripheral edge portions of the main surface 3a of the microcomputer chip 3. With this arrangement, when mounting the microcomputer chip in the die bonding step, it is possible to prevent interference between the collet 40 and the bump electrodes 4.

Figure 13:
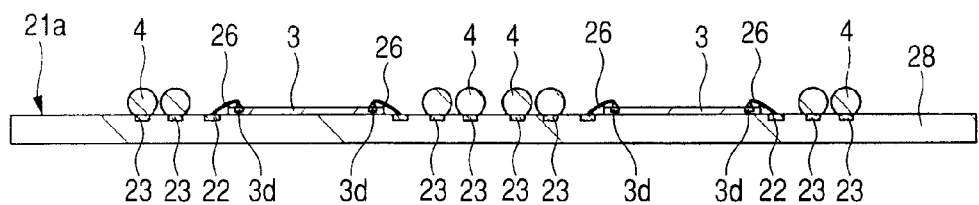
FIG. 13 is a sectional view showing a state in which pads of the semiconductor chips shown in FIG. 11 and terminals of the base substrate were bonded together through wires.

Next, in the wire bonding step, the pads 3d of each microcomputer chip 3 and the terminals 22 of the base substrate 28 are coupled with each other through wires 26. FIG. 13 is a sectional view showing a state in which the pads of the semiconductor chips and terminals of the base substrate both shown in FIG. 11 were wire-bonded to each other.

In this wire bonding step, one end of a wire 26 is bonded to a pad 3d of a microcomputer chip 3, while the other end of the wire is bonded to a terminal 22, to couple the pad 3d and the terminal 22 electrically with each other. The wire bonding is performed using a wire bonding jig (e.g., a jig called capillary) (not shown) so as to form for example such a loop shape as shown in FIG. 13.

In FIG. 13 there is illustrated a so-called normal bonding method wherein first a pad 3d and a wire 26 are bonded to each other (first bonding) and thereafter the wire 26 is bonded to a terminal 22 (second bonding). However, as to in what order the wire 26 is to be bonded, no limitation is made to the normal wire bonding method. For example, there may be adopted a so-called reverse bonding method wherein the terminal 22 is first bonded to the wire 26. In the case of the reverse bonding method, the distance between the terminal 22 and microcomputer chip 3 (chip mounting area 21c) can be made shorter than in the normal bonding method. Thus, the reverse bonding method is preferred from the standpoint of reducing the size of the semiconductor device. In the reverse bonding method, however, since the second bonding is performed for the pad 3d, a bump electrode (not shown) is formed on the pad 3d for bonding of the wire 26. Thus, from the standpoint of omitting the step of forming a bump electrode for wire bonding onto the pad 3d and thereby simplifying the semiconductor device manufacturing process, the normal bonding method is preferred.

Figure 14:
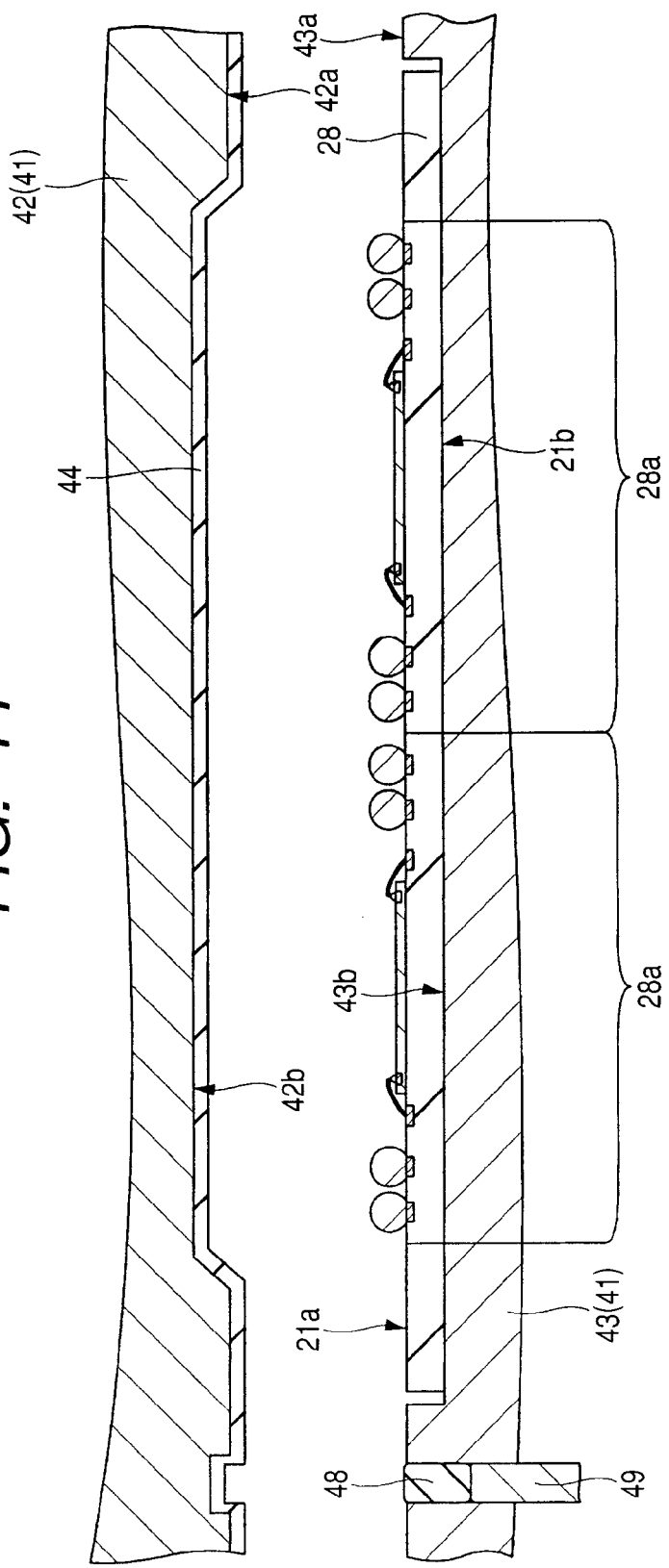
FIG. 14 is a sectional view showing a state in which the base substrate shown in FIG. 13 was disposed in the interior of a molding die.
Figure 15:
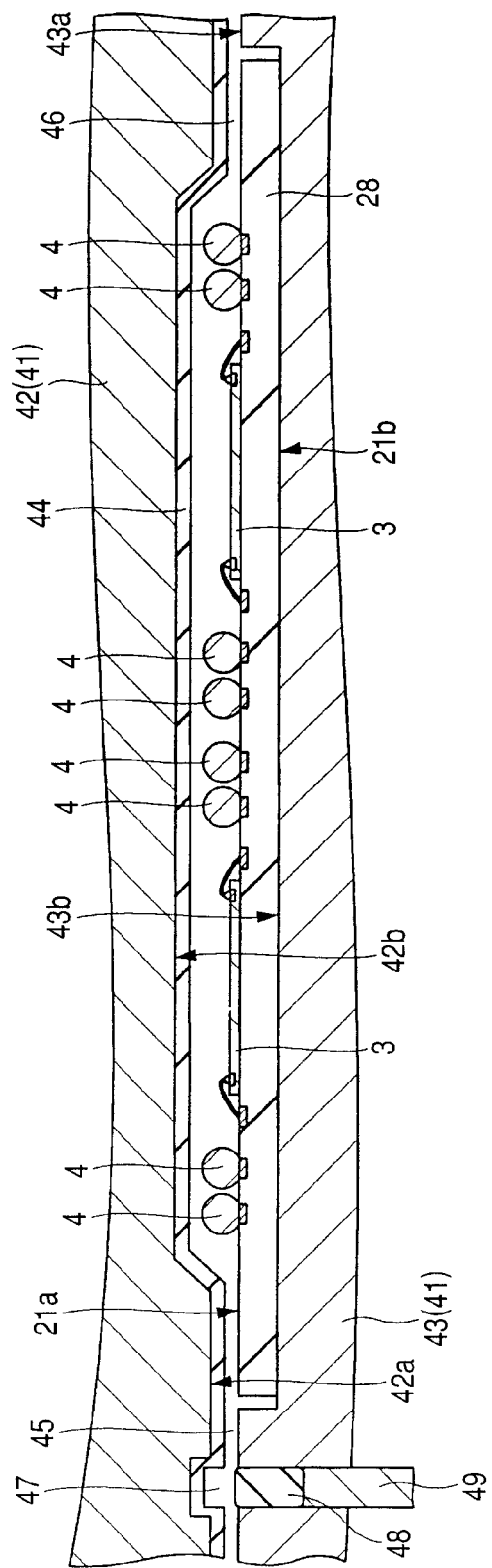
FIG. 15 is a sectional view showing a state in which an upper mold and a lower mold both shown in FIG. 14 were approximated to each other to clamp the base substrate.
Figure 16:
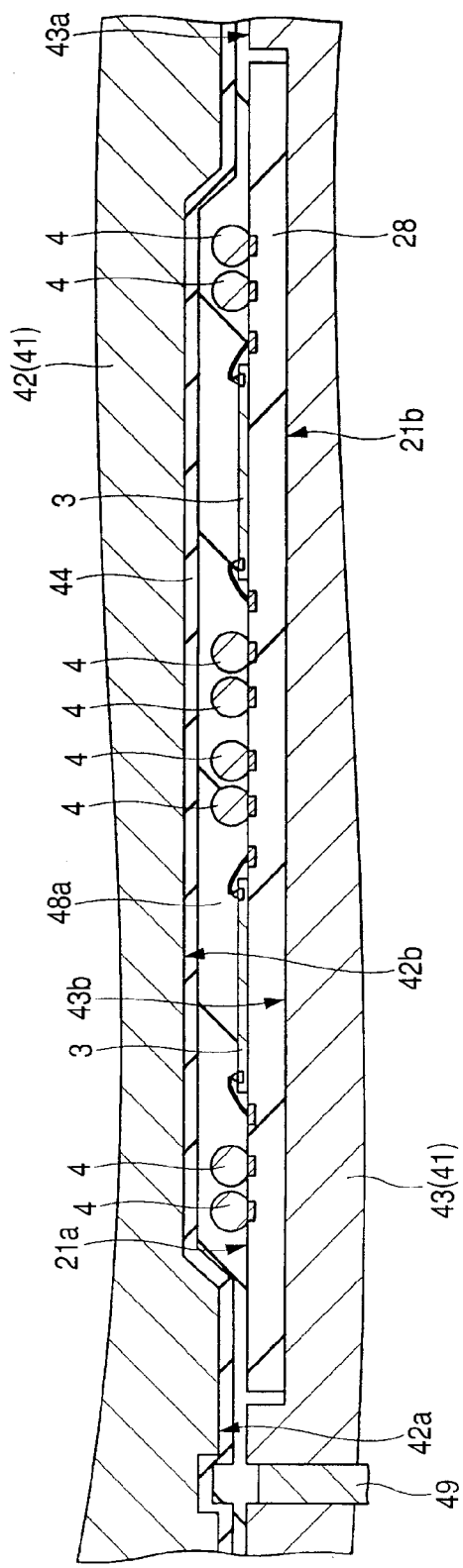
FIG. 16 is a sectional view showing a state in which sealing resin was supplied into a cavity shown in FIG. 15 and a sealing body was formed.
Figure 17:
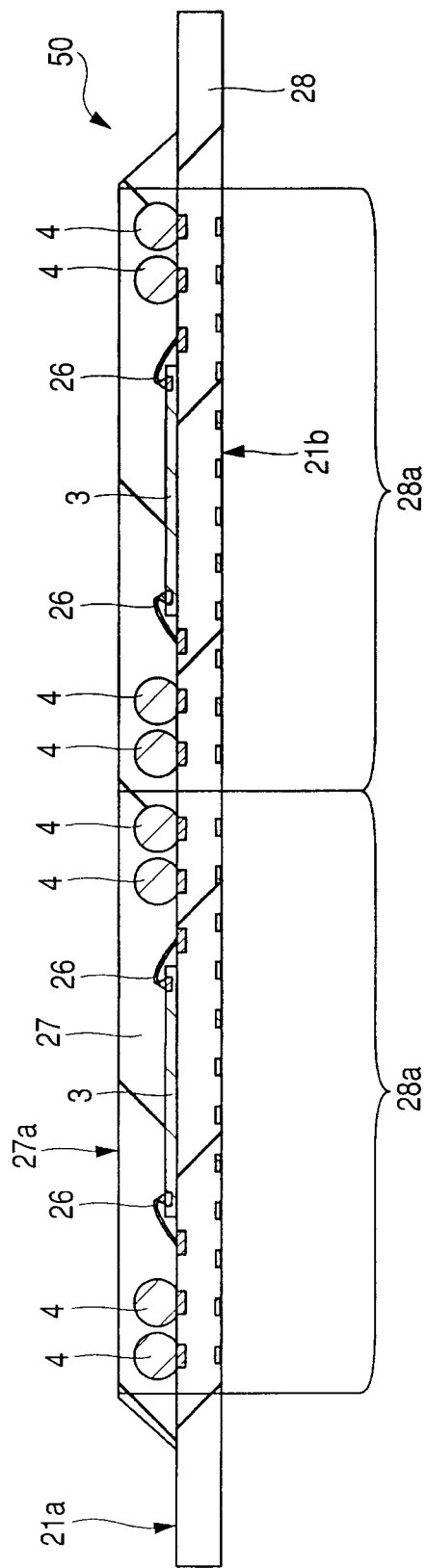
FIG. 17 is a sectional view showing a state after removal of the base substrate shown in FIG. 16 from the molding die.

Next, a description will be given about the sealing step. FIG. 14 is a sectional view showing a state in which the base substrate shown in FIG. 13 is disposed within a molding die, FIG. 15 is a sectional view showing a state in which an upper mold and a lower mold both shown in FIG. 14 were approximated to each other to clamp the base substrate, FIG. 16 is a sectional view showing a state in which sealing resin was supplied into a cavity shown in FIG. 15 and a sealing body was formed, and FIG. 17 is a sectional view showing a state in which the base substrate shown in FIG. 16 was removed from the molding die.

The sealing step includes a molding die providing step for providing a molding die, a base member disposing step of disposing the wiring substrate loaded with semiconductor chips into the molding die, a clamping step of holding and clamping the wiring substrate in a sandwiched state with the molding die, a sealing body-forming step of supplying sealing resin into a cavity of the molding die and forming a sealing resin, and a base member take-out step of taking out the wiring substrate from the molding die. In this embodiment, reference will be made below to the manufacturing process called MAP (Mold Array Process) wherein the wiring substrate having a plurality of product-forming areas arranged in a matrix shape is disposed within one cavity and all the product-forming areas are sealed at a time.

A molding die 41 provided in this molding die providing step includes an upper mold (mold) 42, the upper mold 42 having a lower surface 42a and a cavity (recess, depression) 42b formed on the lower surface 42a side, and a lower mold (mold) 43 having an upper surface 43a opposed to the lower surface 42a.

A film (sheet) 44 formed of a resin material, e.g., polyimide resin, is disposed between the upper mold 42 and the lower mold 43, more specifically, on the lower surface 42a side of the upper mold 42. By suction from the lower surface 42a side of the upper mold 42 the film 44 is brought into close contact with (sucked to) the upper mold 42 in conformity with the shape of the lower surface 42a. By thus disposing the film 44 which is higher in elasticity than the molding die 41 formed of metal, the base substrate 28 with the sealing body formed thereon can be taken out easily in the base member take-out step to be described later.

Next, in the base member disposing step, the base substrate 28 is disposed on the lower mold 43 of the molding die 41. A depression 43b for disposing the base substrate 28 therein is formed in the upper surface 43a of the lower mold 43. In this step, the base substrate is disposed within the depression 43b in a state in which the back surface 21b of the base substrate 28 and the upper surface 43a of the lower mold 43 are opposed to each other. The cavity 42b formed in the upper mold 42 to be combined with the lower mold 43 has an area wider than that of the product-forming areas 28a of the base substrate 28. In this step, the base substrate 28 is disposed in such a manner that a plurality of product-forming areas 28a are received within one cavity 42.

In the subsequent clamping step, the distance between the upper mold 42 and the lower mold 43 is shortened to clamp the base substrate 28 with both upper and lower molds. FIG. 15 shows a gate portion 45 for the supply of sealing resin and an air vent portion 46 for the discharge of intra-cavity gas to the exterior of the molding die 41, in connection with the sealing body-forming step. In this clamping step, the film 44 and the main surface 21a of the base substrate 28 are brought into close contact with each other and clamped in the other area than the gate portion 45 and the air vent portion 46 both shown in FIG. 15.

In the sealing step according to this embodiment, the bump electrodes 4 are sealed completely with sealing resin. In the clamped state, therefore, the film 44 and the bump electrodes 4 are spaced from each other.

Next, in the sealing body-forming step, sealing resin is supplied into the cavity 42b and is cured to form sealing resin. In this step there is adopted a transfer molding method. More particularly, for example as shown in FIG. 15, a pot portion 47 is formed by combining both upper mold 42 and lower mold 43 and a resin tablet 48 disposed in the pot portion 47 is heat-cured and pushed in with a plunger 49, whereby the resin tablet 48 is supplied toward the cavity 42b. For example, the resin table 48 is formed of an epoxy resin which is a thermosetting resin, having a characteristic such that at a temperature lower than its curing temperature it softens on heating and is improved in fluidity. Consequently, when the plunger 49 is pushed in toward the upper mold 42, the resin tablet 48 which has softened in the pot portion 47 flows from the gate portion 45 formed within the molding die 41 into the cavity 42b. With influent pressure of the sealing resin, the gas present within the cavity 42b is discharged from the air vent portion 46 and the interior of the cavity 42b is filled with the sealing resin 48a, as shown in FIG. 16.

In this embodiment, as shown in FIG. 15, the gate portion as a sealing resin supply port is disposed sideways of the semiconductor chip (microcomputer chip 3), and the air vent portion 46 is disposed on the side opposite to the gate portion 45 with respect to the cavity 42b. That is, in this embodiment, since not only the microcomputer chip 3 but also the bump electrodes 4 are sealed in the sealing step, the sealing can be done by the so-called side gate method wherein the sealing resin is supplied sideways of the microcomputer chip 3. In the side gate method the air vent portion 46 is not disposed between the microcomputer chip 3 and the bump electrodes 4, so that the distance between the bump electrodes 4 and the microcomputer chip 3 can be shortened in comparison with the foregoing top gate method. That is, a planar size of the base package 20 obtained can be reduced.

At this time, with the sealing resin supply pressure, the adhesive 29 shown in FIG. 12 is pushed in toward the base substrate 28 so as to fill up the gap 28c. As a result, the adhesive 29 and the insulating film 28d come into close contact with each other.

Thereafter, sealing resin 48a shown in FIG. 16 is heated to its curing temperature to form sealing resin 27 shown in FIG. 17.

A detailed description will now be given about heat-curing. The sealing resin 48a supplied into the molding die 41 is heated to, say, about 150° C., whereby a half or more (e.g., 70% or so) of a curing component contained in the resin is cured, assuming a state called a temporarily cured state. In this temporarily cured state, it is not that the whole of the curing component contained in the resin is cured, but a half or more of the curing component is cured. At this stage the microcomputer chip 3 and the bump electrodes 4 are sealed. However, from the standpoint of stability in strength of the sealing resin 27, it is preferable that the curing component be cured completely. Therefore, after the base member take-out step to be described later, the base substrate 28 formed with the temporarily sealing resin 27 is moved to a heating furnace and is heated again. That is, the so-called eternal curing is performed. In the said temporarily cured state, the adhesive 29 shown in FIG. 12 cures. Thus, according to this embodiment the adhesive 29 can be cured in close contact with the insulating film 28d.

Next, in the base member take-out step, the base substrate 28 formed with the sealing resin 27 shown in FIG. 17 is taken out from the molding die 41 which has been used in the foregoing sealing step.

In this base member take-out step, the lower surface 42a of the upper mold 42 and the upper surface 43a of the lower mold 43 both shown in FIG. 16 are separated from each other and a block molding structure 50 formed with the sealing resin 27 is taken out. At this stage, the bump electrodes 4 are completely sealed with the sealing resin 27 and are not exposed from the front surface 27a. Where required in this step, resin burrs or the like developed in the foregoing sealing step are removed.

Figure 18:
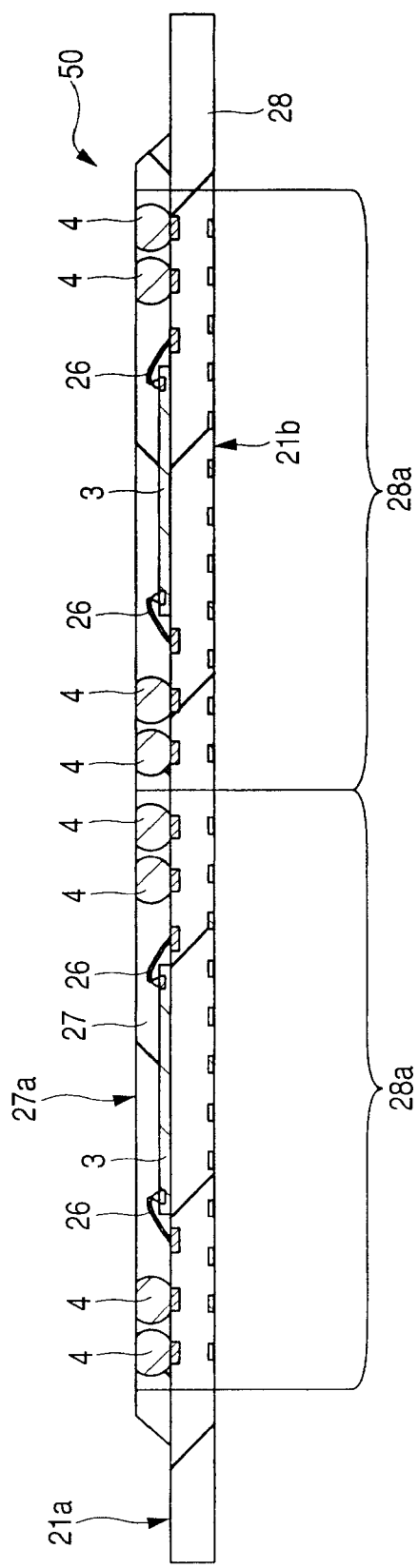
FIG. 18 is a sectional view showing a state in which bump electrodes were partially exposed by grinding a surface of sealing resin shown in FIG. 17.

Next, a description will be given about the bump electrode exposing step. FIG. 18 is a sectional view showing a state in which bump electrodes were partially exposed by grinding the front surface of the sealing resin shown in FIG. 17. In this step, the sealing resin 27 is partially removed so that the bump electrodes 4 are each partially exposed. More particularly, for example in this embodiment, the front surface 27a side of the sealing resin 27 is ground mechanically, allowing the bump electrodes 4 to be exposed. At this time, a part of each bump electrode 4 (more particularly, a top part of each bump electrode 4) is also subjected to grinding, so that each bump electrode 4 assumes such a shape as shown in FIG. 18 in which a generally spherical upper top is cut off.

Further, since the bump electrodes 4 are ground together with the sealing resin 27, the exposed surface of each bump electrode 4 becomes almost level with the front surface 27a of the sealing resin 27. In other words, the bump electrodes 4 do not protrude from the front surface 27a, but each form a substantially flat surface. By the "almost level with" or "substantially flat surface" is meant to include a case where fine concaves and convexes occur in the grinding step.

By exposing the bump electrodes 4 to the front surface 27a side in this step, at the time of stacking another wiring substrate onto the front surface 27a in the base member stacking step to be described later, the bump electrodes 4 can be utilized as terminals for electrical coupling of the said wiring substrate.

Figure 19:
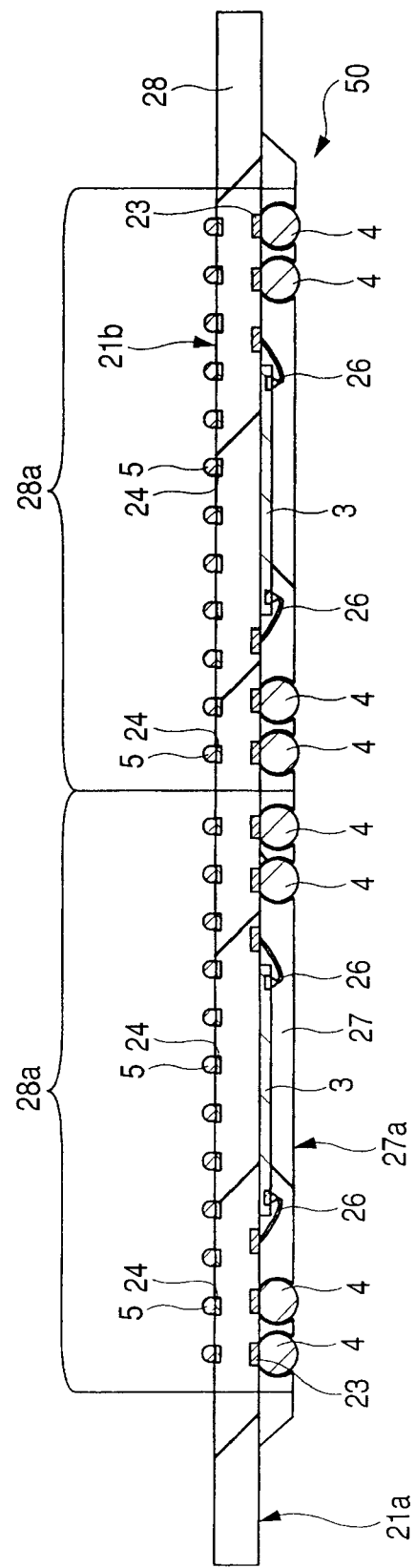
FIG. 19 is a sectional view showing a state in which the bump electrodes shown in FIG. 18 were projected from the front surface of the sealing resin.
Figure 20:
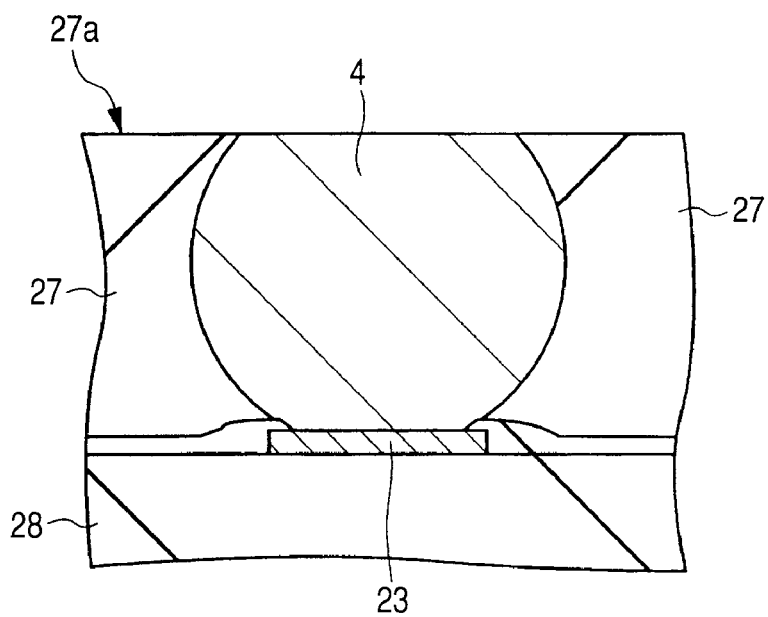
FIG. 20 is an enlarged sectional view of a principal portion, showing a bump electrode and the vicinity thereof shown in FIG. 18.
Figure 21:
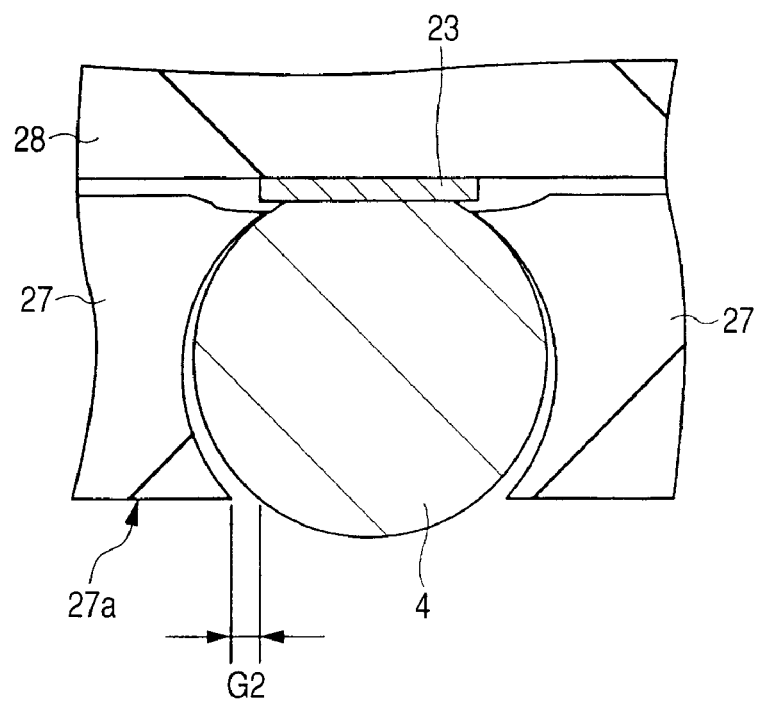
FIG. 21 is an enlarged sectional view of a principal portion, showing on a larger scale a bump electrode shown in FIG. 19.

The following description is now provided about the bump electrode protruding step. FIG. 19 is a sectional view showing a state in which the bump electrodes shown in FIG. 18 were protruded from the front surface of the sealing resin, FIG. 20 is an enlarged sectional view of a principal portion, showing on a larger scale a bump electrode and the vicinity thereof shown in FIG. 18, and FIG. 21 is an enlarged sectional view of a principal portion, showing on a larger scale a bump electrode and the vicinity thereof shown in FIG. 19. In this embodiment, the bump electrode protruding step is performed simultaneously with the foregoing ball mounting step. Therefore, in FIG. 19 there is shown a state in which solder balls 5 are mounted on the back surface 21b side of the base substrate 28.

In this embodiment, as noted above, for positive coupling between the bump electrodes and the terminals (lands) of the stacking wiring substrate, the bump electrodes 4 are protruded from the front surface 27a of the sealing resin 27 prior to the base member stacking step to be described later.

Means for protruding the bump electrodes 4 is not specially limited, but the following means is used in this embodiment by utilizing the fact that the bump electrodes 4 are formed of solder. That is, at least the surface of each bump electrode 4 is re-melted by applying heat treatment to the bump electrode 4 formed of solder, allowing the bump electrode to protrude under surface tension of the solder. In more particular terms, upon re-melting of the bump electrode 4 formed of solder, the bump electrode deforms itself so as to approach a sphere under the influence of surface tension. On the other hand, the already-cured sealing resin 27 may expand a little by the influence of heat, but the degree of that deformation is extremely small in comparison with the bump electrode 4. As a result, as shown in FIG. 21, the bump electrode 4 deformed by heat treatment assumes a protruded state from the front surface 27a of the sealing resin 27.

Moreover, since the bump electrode 4 has been partially removed in the foregoing bump electrode exposing step, the radius of the bump electrode 4 deformed in this bump electrode protruding step is smaller than that of the bump electrode 4 prior to grinding in the bump electrode exposing step. Therefore, the heat-treated bump electrode 4 is separated at least partially from the sealing resin 27 and a gap G2 is formed between the bump electrode 4 and the sealing resin 27, as described above in connection with FIG. 8.

In the heating step for protruding the bump electrode 4 it is necessary to conduct heating at least up to a deforming temperature of the bump electrode, which temperature is preferably the melting point or higher of the solder which configures the bump electrode 4.

On the other hand, also in the ball mounting step of mounting solder balls 5 on the surfaces of lands 24 formed on the back surface 21b of the base substrate 28 shown in FIG. 19, it is necessary to perform heat treatment (reflow treatment) for bonding the lands 24 and the solder balls 5 with each other.

In this embodiment, therefore, this bump electrode protruding step and the ball mounting step are performed at a time to simplify the manufacturing process. By so doing it is possible to protrude the bump electrodes 4 without adding a new step.

In the ball mounting step, with solder balls 5 put on lands 24, both are bonded together by heat treatment. At this time, the bump electrodes 4 which have already been bonded to lands 23 are kept in close contact with the lands 23 under surface tension even if heat treatment is applied thereto in an inverted state as shown in FIG. 19. Thus, in this embodiment, heat treatment (reflow treatment) is performed in a state in which the back surface 21b faces up and the main surface 21a faces down.

Figure 22:
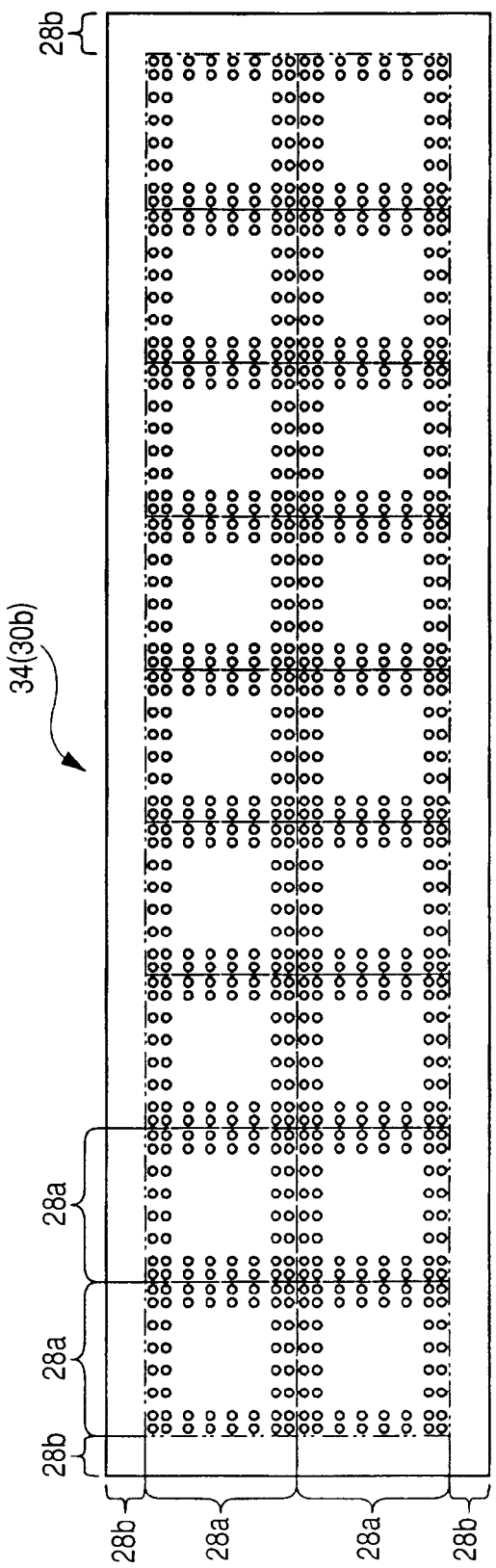
FIG. 22 is a plan view showing a back surface side of a wiring substrate stacked on a block molding structure shown in FIG. 19.
Figure 23:
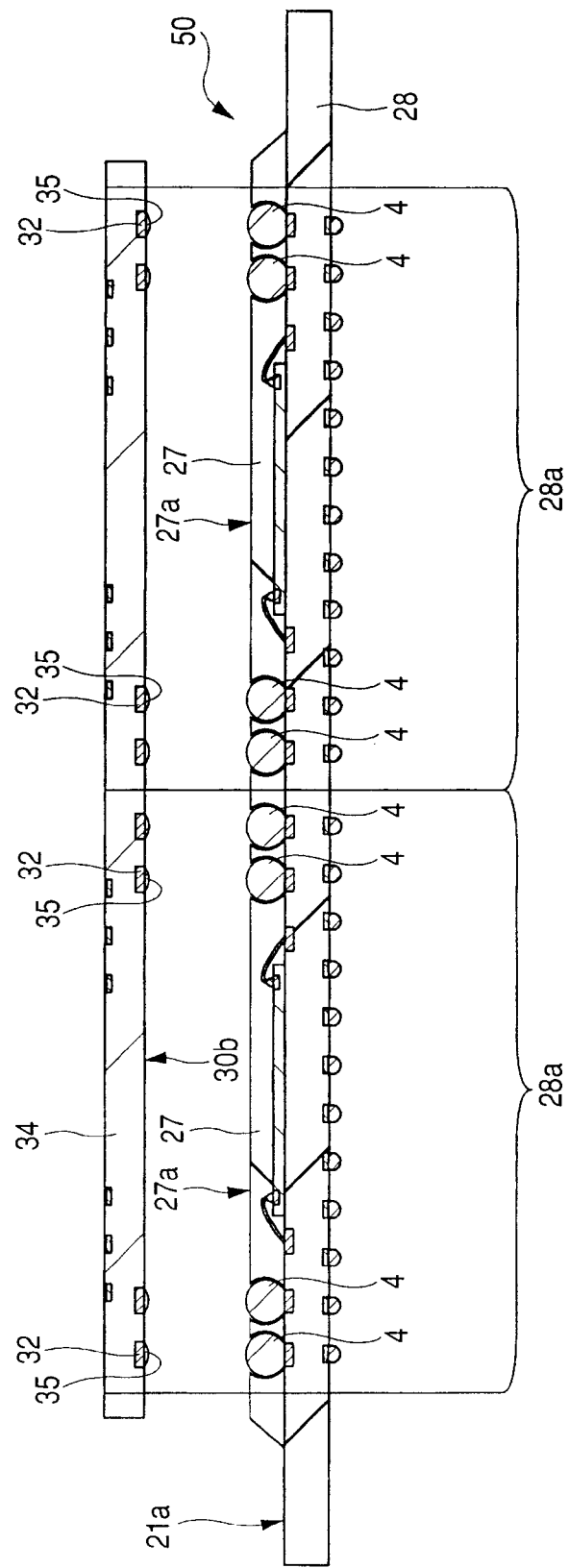
FIG. 23 is a sectional view showing a state in which the wiring substrate shown in FIG. 22 was disposed on the block molding structure shown in FIG. 19.
Figure 24:
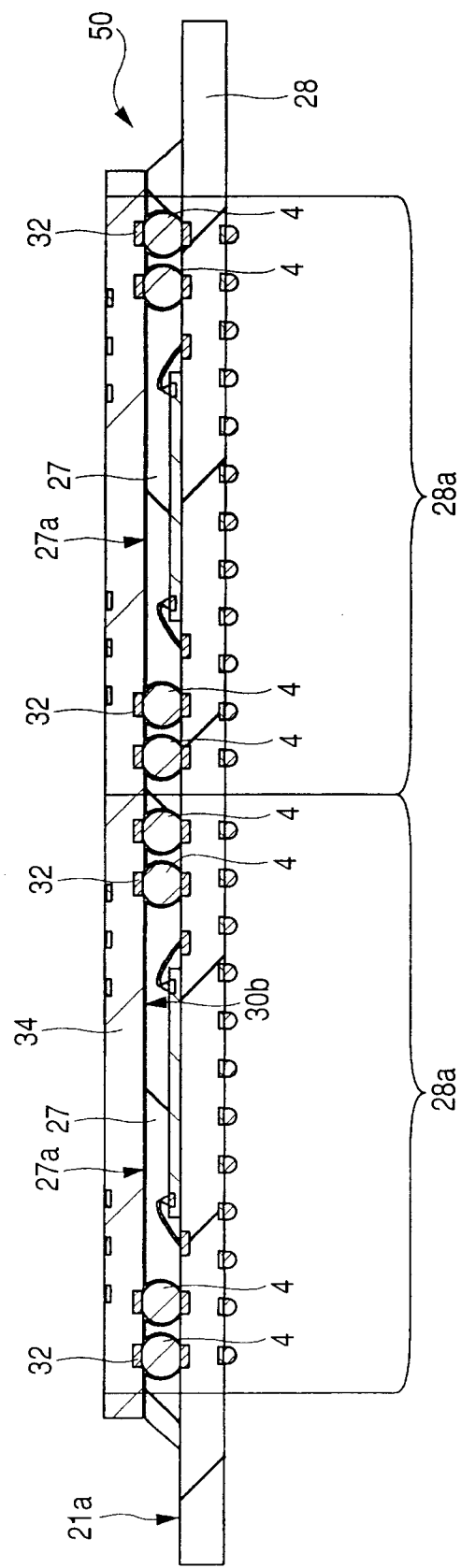
FIG. 24 is a sectional view showing a state in which the wiring substrate and the block molding structure both shown in FIG. 23 were approximated to each other and stacked one on the other.

Next, the following description is provided about the base member stacking step. FIG. 22 is a plan view showing a back surface side of a wiring substrate to be stacked onto the block molding structure shown in FIG. 19, FIG. 23 is a sectional view showing a state in which the wiring substrate shown in FIG. 22 was disposed on the block molding structure shown in FIG. 19, and FIG. 24 is a sectional view showing a state in which the wiring substrate and the block molding structure both shown in FIG. 23 were stacked together in a mutually approximated state.

In this base member stacking step, a wiring substrate 34 corresponding to the interposer substrate 30 shown in FIG. 1 is provided and stacked onto the sealing resin 27. In this embodiment, the package dicing step to be described later is performed after the stacking of the wiring substrate 34. As shown in FIG. 22, like the base substrate 28 described previously in connection with FIG. 9, the wiring substrate 34 provided in this step is a matrix substrate (multi-package substrate) with a plurality of product-forming areas 28a arranged in a matrix shape. By thus stacking the matrix substrate onto the sealing resin 27 and thereafter dicing it into individual products, it is possible to obtain a plurality of substrate-stacked structures at a time and hence possible to improve the production efficiency.

The product-forming areas 28a of the wiring substrate 34 are located at positions where they are registered with the product-forming areas 28a respectively of the base substrate 28. In the product-forming areas 28a on a back surface 30b of the wiring substrate 34 are formed a plurality of lands 32 respectively and bonding members (conductive members, external terminals) 35 formed of solder for example are disposed respectively on surfaces of the lands 32.

In this base member stacking step, with the back surface 30b of the wiring substrate 34 and the front surface 27a of the sealing resin 27 opposed to each other, the lands 32 and the bump electrodes 4 are bonded to each other. However, in the case where the wiring substrate 34 or the block molding structure 50 is warped, the bonding members 35 and the bump electrodes 4 do not become uniform in height. Particularly, in case of mounting the wiring substrate 34 having the plural product-forming areas 28a as in this embodiment, the difference in height among the bonding members 35 is apt to become significant. In view of this point, for example as shown in FIG. 18, if the wiring substrate 34 shown in FIG. 23 is stacked onto the sealing resin 27 in an unprotruded state of the bump electrodes 4, there is a fear that a portion of the lands 32 and a portion of the bump electrodes 4 may not be coupled to each other. If the bonding members 35 shown in FIG. 23 are each formed thick, it is possible to avoid a coupling defect caused by warping of the wiring substrate 34, but the thickness of the resulting package becomes large because the bonding members 35 are each formed thick. That is, the packaging height of each semiconductor device obtained increases.

On the other hand, according to this embodiment, as described above, since this base member stacking step is performed in a protruded state of each bump electrode 4 from the front surface 27a of the sealing resin 27, the bonding members 35 and the bump electrodes 4 can be coupled together positively even if both are not uniform in height. In this embodiment, moreover, since the bump electrodes 4 are protruded, the bonding members 35 and the bump electrodes 4 can be coupled together positively even if the thickness of each bonding member 35 is made small. That is, it is possible to reduce the thickness of the semiconductor device.

The bonding between each bonding member 35 formed on the associated land 32 and each bump electrode 4 is performed by the application of heat treatment (reflow treatment) in a mutually abutted state of the two. Once the bonding member 35 and the bump electrode 4 melt and are bonded to each other, both become united into such a shape of the bump electrode 4 as shown in FIG. 8. There is obtained a block molding structure 50 (see FIG. 24) wherein the wiring substrate 34 and the front surface 27a of the sealing resin 27 are fixed in a spaced state.

Figure 25:
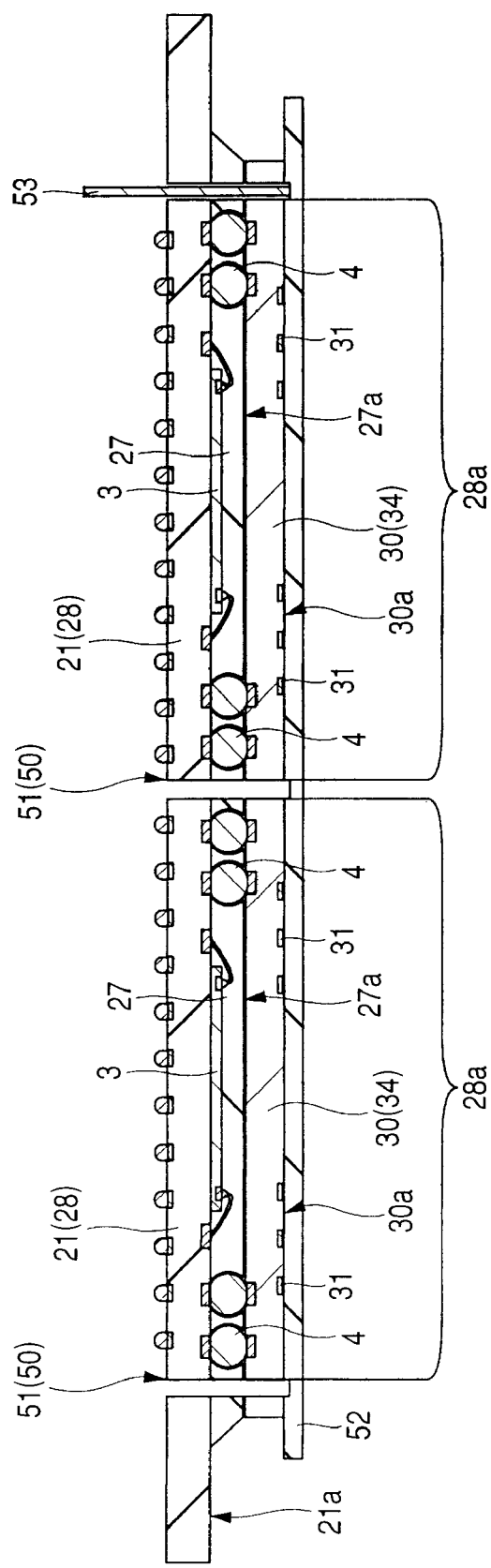
FIG. 25 is a sectional view showing a cut state of the block molding structure and the wiring substrate both shown in FIG. 24.

Next, in the package dicing step, the structure comprising the block molding structure 50 shown in FIG. 24 and the wiring substrate 34 mounted thereon is cut for each product-forming area 28a for division (package dicing) into individual packages. FIG. 25 is a sectional view showing a cut state of both block molding structure and wiring substrate shown in FIG. 24.

In this package dicing step, for example, the block molding structure 50 is inverted (disposed so that the wiring substrate 34 lies on the lower side) and a dicing tape 52 is affixed to a main surface 30a of the wiring substrate 34. In this state, cutting means such as, for example, a dicing blade 53 is scanned along the product-forming areas 28a to cut the block molding structure 50 (see FIG. 24) and the wiring substrate 34 (see FIG. 24), affording a plurality of stacked wiring substrates (electronic devices, semiconductor devices) 51 shown in FIG. 25.

As shown in FIG. 25, the stacked wiring substrates 51 are each a wiring substrate comprising the base substrate 21 and the interposer substrate 30 stacked one on the other. The base substrate 21 and the interposer substrate 30 are fixed and electrically coupled together through the bump electrodes 4. A microcomputer chip 3 is mounted between the base substrate 21 and the interposer substrate 30 and is sealed with the sealing resin 27. That is, the stacked wiring substrates 51 are each a wiring substrate which incorporates the microcomputer chip 3.

Although in this embodiment the package dicing step is performed after the base member stacking step, there may be adopted a modification wherein the package dicing step is performed before the base member stacking step or the bump electrode protruding step. That is, the package dicing step may also be carried out in the state of the block molding structure 50 shown in FIG. 19 or in the state of the block molding structure 50 shown in FIG. 18. In this case, a plurality of such base packages 20 as shown in FIG. 1 are obtained by the package dicing step. Further, the interposer substrate 30 shown in FIG. 1 is mounted onto the front surface 27a of the sealing resin 27. In this case, since the stacking step is performed in the diced state, the manufacturing process becomes more complicated than in the first embodiment. However, since the package dicing step is performed before stacking the wiring substrate 34 (interposer substrate 30), the modification in question is preferred from the standpoint of preventing stress concentration on the bump electrodes 4 in the package dicing step.

Besides, since the stacked wiring substrate 51 shown in FIG. 25 includes the base package 20 (see FIG. 1), it is possible to make an electric drive even without mounting such a sub-package 10 as shown in FIG. 1 onto the main surface 30a of the interposer substrate 30. Therefore, the state of the stacked wiring substrate 51 can be regarded as a completed product. In this case, where required, there are performed electrical inspection and visual inspection and non-defective products are shipped. In this case, the lands 31 formed on the main surface 30a of the interposer substrate 30 serve as extension terminals for mounting the sub-package 10 (see FIG. 1) where required.

Next, the sub-package 10 shown in FIG. 1 is provided and is mounted onto the main surface 30a of the interposer substrate 30. A description will now be given about the sub-package mounting step. As the step of providing the sub-package 10, namely, as the step of fabricating the sub-package, there may be used a known process for fabricating a BGA type package and therefore a detailed description thereof is here omitted. For example, the process of fabricating the sub-package 10 shown in FIG. 1 includes a substrate providing step of providing the sub-substrate 11, a die bonding step of stacking and fixing a plurality of memory chips 2 onto the main surface 11a of the sub-substrate 11, a wire bonding step of coupling a plurality of pads 2c formed on the main surface 2a of the memory chip 2 and terminals 12 formed on the main surface 11a of the sub-substrate 11 electrically with each other through a plurality of wires 14, a sealing (resin sealing) step of disposing sealing resin 15 on the main surface 11a side of the sub-substrate 11 to seal the memory chip 2 and the wires 14, and a ball mounting step of bonding a plurality of solder balls 6 to the surfaces of plural lands 13 formed on the back surface 1ib of the sub-substrate 11. In this embodiment, the foregoing MAP method is applied to the manufacturing process for the sub-package 10. Therefore, the package dicing step is performed after the foregoing ball mounting step to afford the sub-package 10 shown in FIG. 1.

Next, the sub-package 10 provided as above is mounted onto the interposer substrate 30. In this step, as shown in FIG. 1, the back surface 1ib of the sub-substrate 11 and the main surface 30a of the interposer substrate 30 are brought into opposition to each other and the solder balls 6 and the lands 31 are disposed so as to be registered with each other. In this state, heat treatment (reflow treatment) is performed, causing the solder balls 6 to be melted and bonded to the lands 31 and thereby coupling the two electrically with each other.

From the standpoint of improving the bondability between the solder balls 6 and the lands 31 it is preferable to perform the heat treatment in a state in which a solder material containing a flux component called cream solder is applied beforehand to the surfaces of the lands 31. In this case, a washing step of washing a residual flux component is performed after the bonding. At this time, water might get in from the gap between the back surface 30b of the interposer substrate 30 and the front surface 27a of the sealing resin 27, but in this embodiment the water thus entered can be removed easily because the sealing resin 27 and the interposer substrate 30 are spaced from each other.

Second Embodiment

Figure 26:
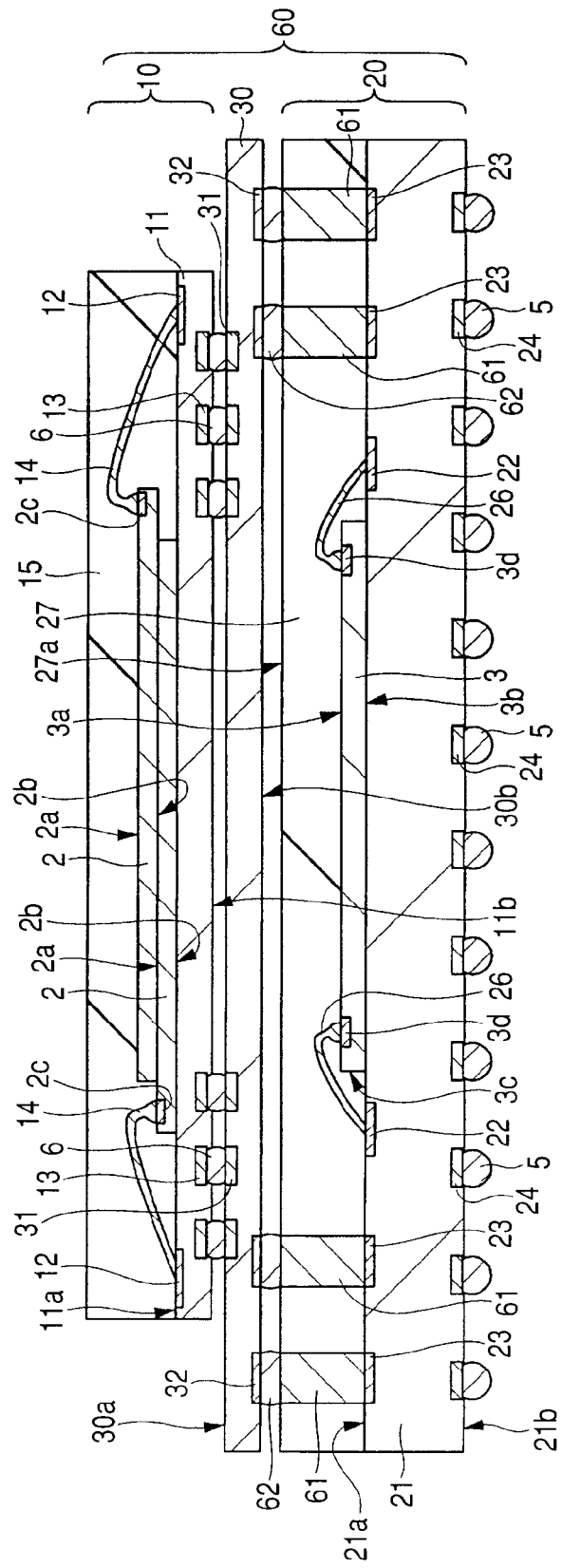
FIG. 26 is a sectional view showing an entire structure of a semiconductor device according to another embodiment of the present invention.
Figure 27:
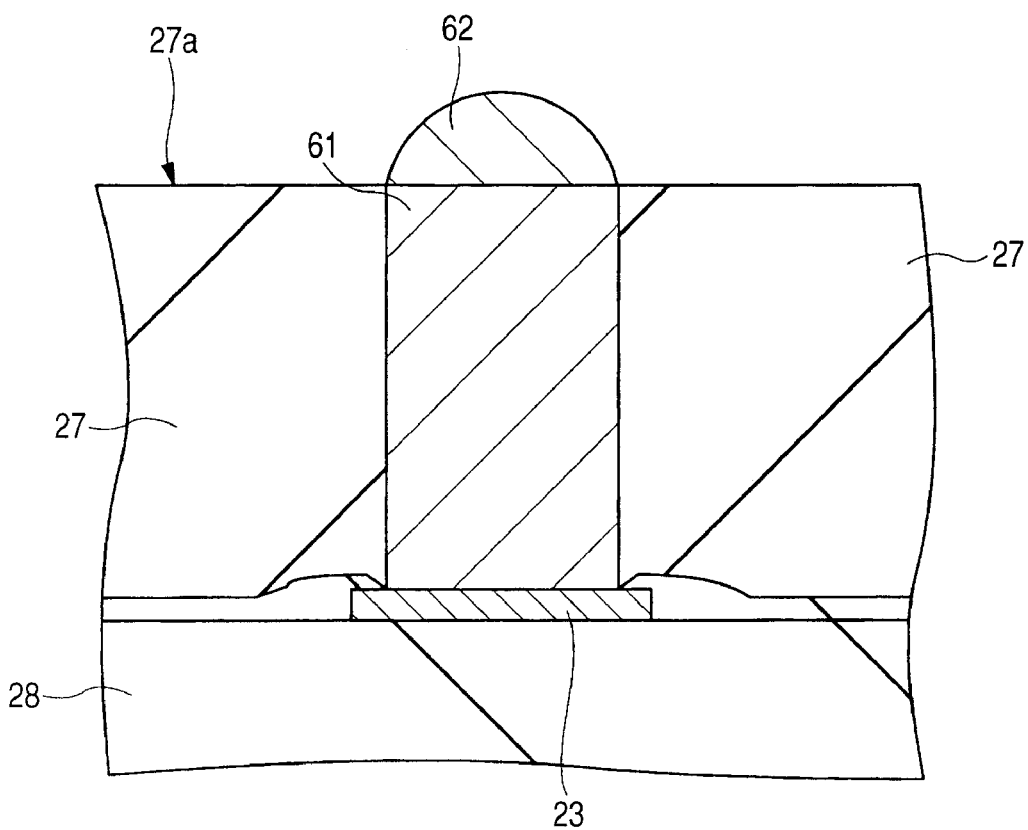
FIG. 27 is an enlarged sectional view of a principal portion, showing a step of bonding a bump electrode onto an electrode post and allowing it to project from a surface of sealing resin in a manufacturing process for the semiconductor device shown in FIG. 26.

In the above first embodiment the bump electrodes 4 as solder balls are protruded from the front surface 27a of the sealing resin 27 by being heat-treated. However, the conductive members for electrical coupling between stacked substrates are not limited to the bump electrodes as solder balls. In this second embodiment a description will be given about the use of a columnar conductive member. FIG. 26 is a sectional view showing an entire structure of a semiconductor device according to this second embodiment and FIG. 27 is an enlarged sectional view showing a step of bonding a bump electrode onto an electrode post so as to protrude from the surface of sealing resin in a process for manufacturing the semiconductor device shown in FIG. 26. In this second embodiment reference will be made mainly to a different point from the previous first embodiment and explanations overlapping the first embodiment will be omitted in principle.

A POP 60 of this second embodiment shown in FIG. 26 is different from the POP 1 of the first embodiment in that the conductive members for electrical coupling between the base substrate 21 and the interposer substrate 30 are electrode posts (conductor posts) 61. More specifically, the POP 60 comprises a plurality of columnar electrode posts 61 bonded respectively onto the lands 23 formed on the base substrate 21. Upper surfaces (surfaces positioned on the side opposite to the surfaces bonded to the lands 23) of the electrode posts 61 are exposed from the front surface 27a of the sealing resin 27 and a plurality of solder members (bump electrodes) 62 as conductive members are bonded to the exposed surfaces respectively. The lands 32 of the interposer substrate 30 and the lands 23 of the base substrate 21 are coupled with each other electrically through the electrode posts 61 and the solder members 62.

In case of coupling substrates electrically with use of the electrode posts 61 as in this embodiment, the electrode posts 61 can each be formed thin in comparison with the bump electrodes 4, i.e., solder balls, described in the first embodiment. Therefore, the layout pitch of the lands 23 can be made narrow and hence, in comparison with the first embodiment, it is possible to reduce the size of the semiconductor device and increase the number of terminals per unit area (i.e., high integration).

Each of the electrode posts 61 is formed of for example Cu beforehand in a columnar shape and it is bonded and fixed onto a land 23 through a conductive adhesive (not shown). As the conductive adhesive there may be used, for example, an adhesive called Ag paste comprising a thermosetting resin and metal particles such as Ag particles incorporated in the resin. Such a conductive adhesive as Ag paste can be fixed by bonding thereof at a temperature lower than its curing temperature and by subsequent heating to cure the thermosetting resin component. Moreover, since conduction can be ensured through the metal particles contained in the thermosetting resin, each electrode post 61 and land 23 can be coupled together electrically.

In case of forming the electrode posts 61 by the plating method, it is preferable that the electrode posts be formed before the die bonding step. That is, it is preferable that the electrode posts 61 be formed beforehand on the lands 23 of the base substrate 28 which is provided in the base member providing step described in the first embodiment. This is for preventing stain of the microcomputer chip 3 and wires 26 in the plating step.

In case of fixing each electrode post 61 preformed in a columnar shape adhesively onto the associated land 23 through a conductive adhesive (not shown), there does not occur the above problem involved in the plating method and therefore the electrode posts 61 can be fixed adhesively after the die bonding step. However, as described in the previous first embodiment, from the standpoint of preventing wire deformation and breaking and from the standpoint of improving the adhesion between an adhesive and an insulating film on a wiring substrate in case of using DAF as the adhesive for fixing the microcomputer chip 3 adhesively, it is preferable to fix the electrode posts 61 adhesively before performing the die bonding step.

In connection with the method for exposing the electrode posts 61 from the front surface 27a of the sealing resin 27, the electrode posts 61 can be exposed by for example grinding and removing the sealing resin 27 after complete sealing of the electrode posts 61 in the sealing step.

Even in case of using the electrode posts 61 as in this embodiment, bump electrodes are protruded on the exposed surfaces of the electrode posts 61 prior to coupling with the wiring substrate 34 (interposer substrate 30) described in the first embodiment. That is, as shown in FIG. 27, the solder members 62 are each bonded to the exposed surface of each electrode post 61 and protruded from the front surface 27a of the sealing resin 27. As a result, in the base member stacking step described in the first embodiment, all the lands 32 and electrode posts 61 can be electrically coupled with each other positively.

In this embodiment, however, the electrode posts 61 and the sealing resin 27 are formed in close contact with each other. That is, such a gap G2 as shown in FIG. 8 or FIG. 21 and described in the first embodiment is not formed. Therefore, when the solder members 62 are heat-treated and bonded respectively to the lands 32 (see FIG. 26), the electrode posts 61 do not deform largely, so that the gap between the front surface 27a of the sealing resin and the back surface 30b of the interposer substrate 30 becomes wide as shown in FIG. 26 in comparison with the first embodiment. Thus, the first embodiment is preferred from the standpoint of reducing the thickness of the semiconductor device.

Third Embodiment

In the first embodiment, the bump electrodes 4 formed of solder are heat-treated and are thereby protruded from the front surface 27a of the sealing resin 27, but in this third embodiment another method for protruding the bump electrodes 4 will be described. In this embodiment reference will be made mainly to a different point from the first embodiment and descriptions overlapping the first embodiment will be omitted in principle.

Figure 28:
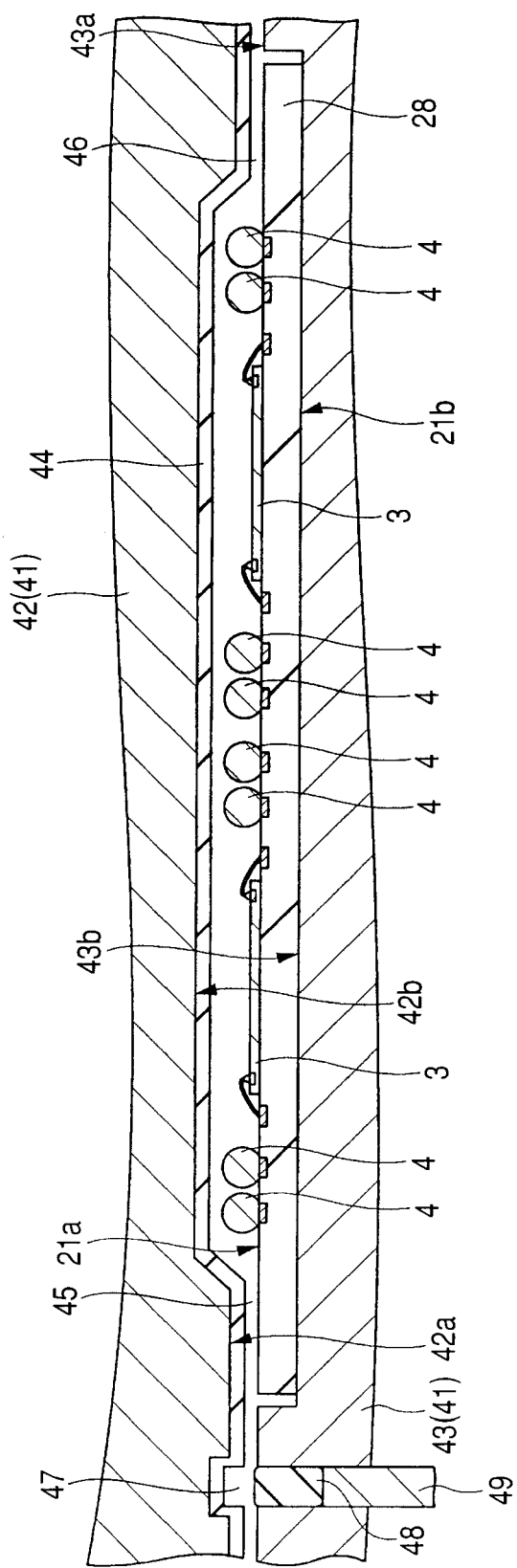
FIG. 28 is a sectional view showing a state in which an upper mold and a lower mold were approximated to each other to clamp a base substrate in a sealing step in a method for manufacturing a semiconductor device according to a further embodiment of the present invention.
Figure 29:
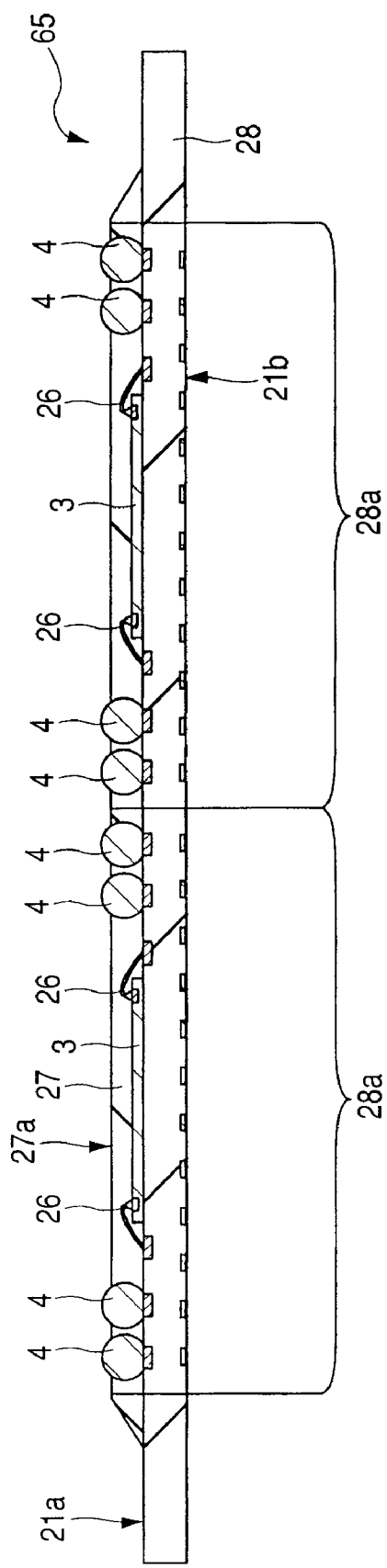
FIG. 29 is a sectional view showing a block molding structure obtained by the semiconductor manufacturing method according to the embodiment illustrated in FIG. 28.

FIG. 28 is a sectional view showing a state in which an upper mold and a lower mold were approximated to each other to clamp a base substrate in a sealing step in a method for manufacturing a semiconductor device according to this third embodiment. FIG. 29 is a sectional view showing a block molding structure obtained by the semiconductor device manufacturing method according to this embodiment.

The semiconductor device manufacturing method according to this embodiment and that of the first embodiment are different in the sealing step, more specifically, in the clamping step.

In this third embodiment, as shown in FIG. 28, a film (sheet) 44 disposed between the base substrate 28 and the upper mold 42 is brought into abutment against the bump electrodes 4 in the clamping step. As noted previously, the film 44 is formed of a resin material higher in elasticity than the molding die 41, e.g., polyimide. By utilizing this elasticity, the tops of the bump electrodes 4 are bitten into the film 44.

With the bump electrodes 4 bitten into the film 44, sealing resin is supplied and cured. As a result, there is obtained a block molding structure 65 with the bump electrodes 4 exposed (more specifically, protruded) from the front surface 27a of the sealing resin 27.

According to this embodiment, since the bump electrodes 4 can be protruded in the sealing step, the bump electrode protruding step can be omitted unlike the manufacturing method of the first embodiment. Further, by omitting the bump electrode protruding step it is possible to prevent the occurrence of dust particles which is caused by mechanical grinding of both sealing resin 27 and bump electrodes 4.

Since the semiconductor device manufacturing method according to this embodiment does not include the step of grinding the bump electrodes 4 partially, the bump electrodes 4 do not deform significantly, but remain closely contacted with the sealing resin 27, even if heat treatment is subsequently applied thereto. That is, such a gap G2 as shown in FIG. 8 or FIG. 21 and described above in the first embodiment is not formed. Consequently, as compared with the first embodiment, the gap between the front surface 27a of the sealing resin 27 and the back surface 30b (see FIG. 1) of the interposer substrate 30 (see FIG. 1) becomes wide. Thus, the first embodiment is preferred from the standpoint of reducing the thickness of the semiconductor device.

Although the present invention has been described above concretely on the basis of embodiments thereof, it goes without saying that the present invention is not limited to the above embodiments, but that various changes may be made in the scope not departing from the gist of the invention.

Figure 30:
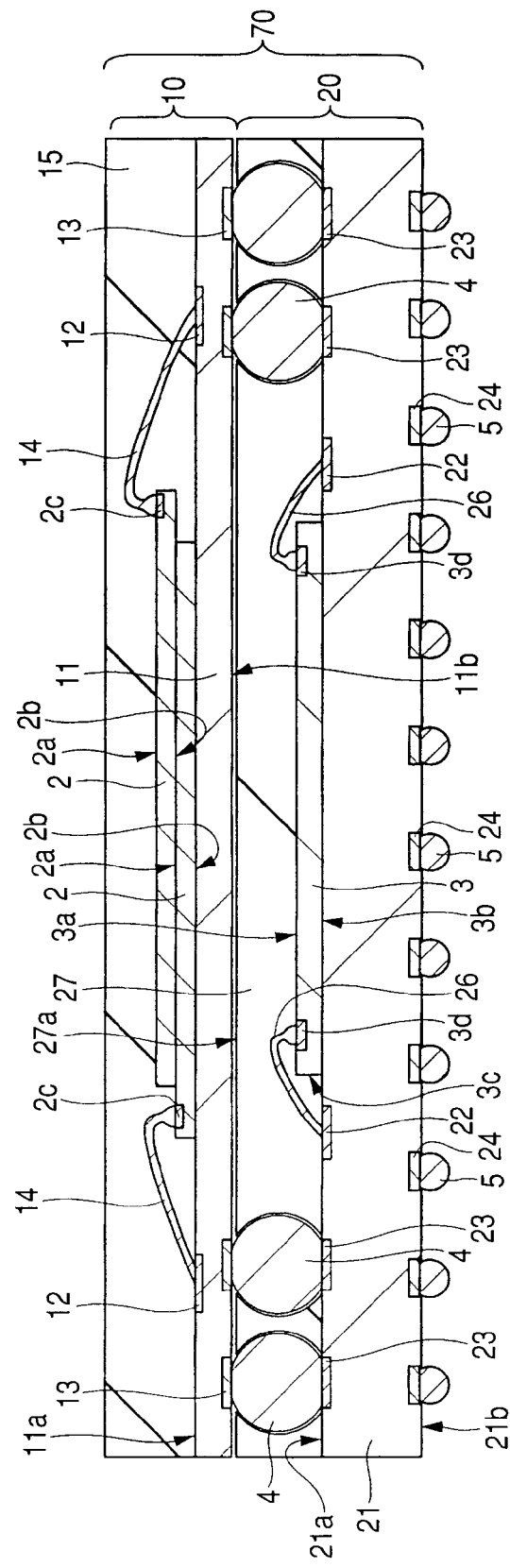
FIG. 30 is a sectional view showing a first modification of the semiconductor device shown in FIG. 1.

For example, in the first to third embodiments, the base package 20 and the sub-package 10 are coupled with each other electrically through the interposer substrate 30 from the standpoint of improving the design freedom of both packages. However, like POP 70 shown in FIG. 30, there may be adopted a structure wherein plural lands 13 formed on the back surface 11b of the sub-substrate 11 and plural bump electrodes 4 are bonded to each other. FIG. 30 is a sectional view showing a first modification of the semiconductor device shown in FIG. 1.

In case of coupling the lands 13 and the bump electrodes 4 with each other like POP 70, it is possible to omit the interposer substrate 30 (see FIG. 1) unlike the first embodiment, so that the packaging height of the semiconductor device can be further reduced as compared with POP 1. The manufacturing process can also be simplified because it is possible to omit the base member stacking step described in the first embodiment.

Figure 31:
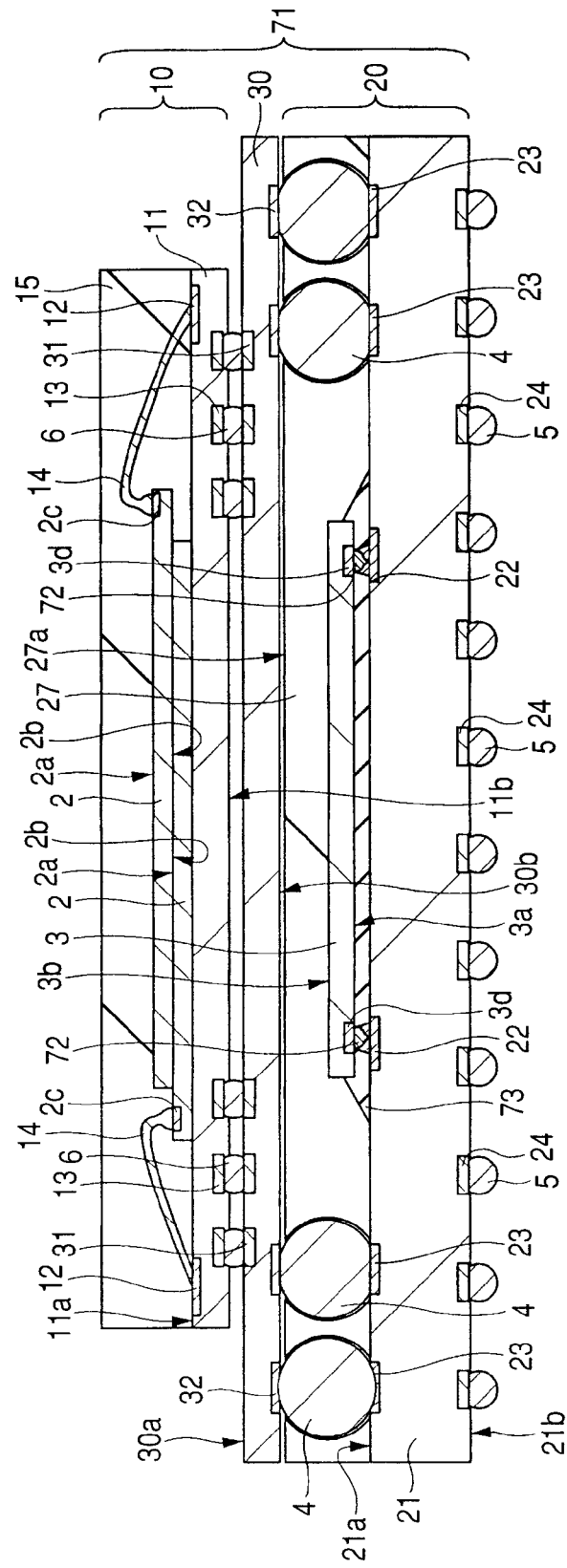
FIG. 31 is a sectional view showing a second modification of the semiconductor device shown in FIG. 1.

In the first to third embodiments the microcomputer chip 3 and the memory chip 2 are mounted by the face-up method. However, for example like a base package 20 of the POP 71 shown in FIG. 31, there may be adopted a so-called face-down method (flip-chip mounting method) wherein the microcomputer chip 3 is mounted with its main surface 3a opposed to the main surface 21a of the base substrate 21. FIG. 31 is a sectional view showing a second modification of the semiconductor device shown in FIG. 1.

In the face-down mounting method, pads 3d formed on the main surface 3a and terminals 22 are coupled with each other electrically through bumps (conductive members) 72 formed on the surfaces of the pads 3d. The bumps 72 are formed of gold (Au) for example and are bonded to the terminals 22 through solder members.

In the face-down mounting method, from the standpoint of protecting the bonded portions including the bumps 72, under-fill resin 73 is disposed between the main surface 3a of the microcomputer chip 3 and the main surface 21a of the base substrate 21.

In case of mounting the microcomputer chip 3 by the face-down mounting method, as shown in FIG. 31, it is not necessary to give consideration to such a wire loop height as described above in the first embodiment, so that the thickness of the sealing resin 27 can be made smaller than in the first embodiment. That is, the packaging height can be further reduced. More specifically, in the bump electrode exposing step described in the first embodiment, the sealing resin 27 can be made extremely thin by grinding the resin toward the back surface 3b of the microcomputer chip 3. For example, the grinding can be done until exposure of the back surface 3b of the microcomputer chip 3. However, if a gap is formed between the microcomputer chip 3 and the sealing resin 27 due to a difference in the coefficient of linear expansion between the microcomputer chip 3 and the sealing resin 27, the occurrence of a moisture absorption defect is possible. Therefore, from the standpoint of improving the reliability of the semiconductor device, it is preferable that the back surface 3b of the microcomputer chip 3 be covered with the sealing resin 27.

An electronic part to be mounted on the POP is not limited to the semiconductor chip. FIG. 32 is a sectional view showing a third modification of the semiconductor device shown in FIG. 1. For example, like POP 80 shown in FIG. 32, there also may be mounted a chip part (electronic part) 81 formed with active elements such as resistor and capacitor, as well as a package (electronic part) 82 formed with functional elements such as IPC (Integrated Passive Component) as an integration of passive elements using MEMS (Micro Electro Mechanical Systems) and semiconductor technology (thin film technology). Also, plural such electronic parts may be mounted as a multi-chip module.

For example, in the above embodiments, the bump electrode-forming step may be performed before the die bonding step and the wire bonding step. In this case, however, from the standpoint of preventing deformation of the wires 26 it is preferable that the bump electrodes 4 and the lands 23 be bonded together without using a flux material.

It is preferable that the bump electrode-forming step be performed for example in an inert gas atmosphere such as a nitrogen atmosphere to prevent surface oxidation of the bump electrodes 4 and lands 23 as metals to be bonded. Also, it is preferable that a thin film of a metallic material more difficult to be oxidized than copper, such as a thin gold film, be formed on the surface of each land 23 to prevent surface oxidation of the land. Further, for example as the bump electrodes 4, such columnar conductive members (e.g., conductor posts called copper posts) as described in the second embodiment may be used instead of solder balls and bonded to the lands 23, whereby the use of flux material can be avoided.

Although the above first to third modifications have been described as modifications of the first embodiment, they also can be applied as modifications of the second or the third embodiment.

The present invention is applicable to an electronic device (semiconductor device) wherein on a main surface of a base member with an electronic part such as a semiconductor chip mounted thereon there is further stacked another wiring substrate.

What is claimed is:

1. A method of manufacturing a semiconductor device, comprising the steps of:
    (a) providing a first wiring substrate including a first main surface, a plurality of bonding leads formed on the first main surface, a plurality of first lands formed on the first main surface, a first back surface opposed to the first main surface, and a plurality of second lands formed on the first back surface;
    (b) disposing a plurality of second conductive members over the first lands of the first wiring substrate;
    (c) mounting a first semiconductor chip on the first main surface of the first wiring substrate, the first semiconductor chip including a second main surface, a plurality of electrode pads formed on the second main surface, and a second back surface opposed to the second main surface, the plurality of bonding leads being arranged in plan view in a region of the first main surface between the first semiconductor chip and the plurality of first lands;
    (d) electrically connecting the electrode pads of the first semiconductor chip and the bonding leads of the first wiring substrate via a plurality of first conductive members, respectively;
    (e) sealing the first semiconductor chip and the second conductive members with resin forming a sealing body;
    (f) after the step (e), removing a portion of the sealing body such that each of the second conductive members is exposed at a front surface of the sealing body; and
    (g) after the step (f), reforming the second conductive members without stacking another member on the second conductive members such that a part of each second conductive member protrudes from the front surface of the sealing body.

2. A method according to claim 1, wherein step (f) includes grinding the front surface of the sealing body.

3. A method according to claim 1, wherein step (g) includes performing a heat treatment.

4. A method according to claim 3, wherein the heat treatment is followed by cooling such that each of the second conductive members partially protrudes from the front surface of the sealing body and partially separates from the sealing body.

5. A method according to claim 3, wherein, when performing the heat treatment in the step (g), a plurality of solder balls are bonded to surfaces of the second lands respectively.

6. A method according to claim 4, wherein the second conductive members are bump electrodes.

7. A method according to claim 4, wherein the second conductive members are ball electrodes.

8. A method according to claim 5, further comprising the steps of:
(h) after the step (g), mounting over the sealing body a second wiring substrate including a third main surface, a plurality of terminals formed on the third main surface, a third back surface opposed to the third main surface, and a plurality of third lands formed on the third back surface and electrically connected to respective ones of the terminals, and electrically connecting the second conductive members and the third lands.

9. A method according to claim 6, wherein the second conductive members are formed of a solder material.

10. A method according to claim 7, wherein the second conductive members are formed of a solder material.

11. A method according to claim 8, wherein a second semiconductor chip, which is electrically connected to the terminals, is mounted on the third main surface of the second wiring substrate.

12. A method of manufacturing a semiconductor device comprising the steps of:
(a) providing a first wiring substrate including an upper surface, a plurality of bonding leads formed on the upper surface, a plurality of first lands formed on the upper surface and arranged closer to a peripheral portion of the upper surface than the bonding leads, a lower surface opposite the upper surface, and a plurality of second lands formed on the lower surface;
(b) disposing a plurality of electrodes over the first lands of the first wiring substrate, respectively, each of the electrodes being comprised of a solder material;
(c) mounting a first semiconductor chip on the upper surface of the first wiring substrate, the first semiconductor chip including a main surface, a plurality of pads formed on the main surface, and a back surface opposite the main surface;
(d) electrically connecting the pads of the first semiconductor chip with the bonding leads of the first wiring substrate via a plurality of conductive members, respectively;
(e) sealing the first semiconductor chip and the electrodes with resin forming a sealing body;
(f) after the step (e), removing a portion of the sealing body such that a part of each of the electrodes is exposed from an upper surface of the sealing body; and
(g) after the step (f), performing a heat treatment without stacking another member on the electrodes such that the part of each of the electrodes is caused to protrude from the upper surface of the sealing body.

13. The method according to claim 12, wherein step (f) includes grinding the upper surface of the sealing body.

14. The method according to claim 12, wherein step (g) includes cooling the electrodes such that a portion of each of the electrodes is caused to separate from the sealing body.

15. The method according to claim 12, wherein, when performing the heat treatment in step (g), a plurality of solder balls are bonded to surfaces of the second lands respectively.

16. The method according to claim 12, further comprising:
(h) after step (g), mounting a second semiconductor device over the sealing body and electrically connecting said electrodes with a plurality of third lands on the second semiconductor device, respectively,
wherein the second semiconductor device has a second wiring substrate including:
a second upper surface,
a plurality of terminals formed on the second upper surface, and
a second lower surface opposite the second upper surface, and
the plurality of third lands are formed on said second lower surface and are electrically connected with the plurality of terminals.

17. The method according to claim 16, wherein a second semiconductor chip, which is electrically connected to the plurality of terminals of the second wiring substrate, is mounted over the second upper surface of the second wiring substrate.

* * * * *